(12) United States Patent
Oishi et al.

(10) Patent No.: US 6,335,252 B1
(45) Date of Patent: Jan. 1, 2002

(54) SEMICONDUCTOR DEVICE MANUFACTURING METHOD

(75) Inventors: Toshiyuki Oishi; Yukio Nishida; Hirokazu Sayama; Hidekazu Oda, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/564,550

(22) Filed: May 4, 2000

(30) Foreign Application Priority Data

Dec. 6, 1999 (JP) .......................................... 11-345924

(51) Int. Cl.⁷ .................. H01L 21/336; H01L 21/8238; H01L 21/3205
(52) U.S. Cl. ...................... 438/303; 438/231; 438/305; 438/595
(58) Field of Search ................................ 438/230, 231, 438/232, 303, 305, 306, 595

(56) References Cited

U.S. PATENT DOCUMENTS

| | | | |
|---|---|---|---|
| 4,703,551 A | * 11/1987 | Szluk et al. ................. | 438/220 |
| 4,757,026 A | * 7/1988 | Woo et al. ................... | 438/231 |
| 5,166,087 A | * 11/1992 | Kakimoto et al. .......... | 438/302 |
| 5,512,771 A | * 4/1996 | Hiroki et al. ................ | 257/369 |
| 5,599,723 A | * 2/1997 | Sato ............................ | 438/320 |
| 5,766,991 A | * 6/1998 | Chen .......................... | 438/231 |
| 5,780,896 A | * 7/1998 | Ono ............................ | 257/344 |
| 5,874,343 A | * 2/1999 | Fulford, Jr. et al ......... | 438/305 |
| 6,110,785 A | * 8/2000 | Spikes, Jr. et al. .......... | 438/299 |
| 6,124,610 A | * 9/2000 | Cheek et al. ................ | 257/328 |
| 6,144,071 A | * 11/2000 | Gardner et al. ............. | 257/344 |
| 6,153,455 A | * 11/2000 | Ling et al. .................. | 438/231 |
| 6,184,097 B1 | * 2/2001 | Yu .............................. | 438/299 |

FOREIGN PATENT DOCUMENTS

| | | |
|---|---|---|
| JP | 63-142677 | 6/1988 |
| JP | 4-350942 | 12/1992 |
| JP | 6-333943 | 12/1994 |
| JP | 7-142726 | 6/1995 |
| JP | 8-186257 | 7/1996 |
| JP | 10-200097 | 7/1998 |

* cited by examiner

*Primary Examiner*—Matthew Smith
*Assistant Examiner*—Lex H. Malsawma
(74) *Attorney, Agent, or Firm*—Oblon, Spivak, McClelland, Maier & Neustadt, P.C.

(57) ABSTRACT

An MIS transistor manufacturing method which can prevent unwanted diffusion of extensions caused by the drive to the source/drain so that the diffusion of the source/drain and the diffusion of the extensions can independently be controlled so as to obtain optimum structure for each. Source/drain are formed by ion implantation using, as a mask, L-shaped silicon nitride films formed on sides of a gate electrode and silicon oxide films covering the silicon nitride films. The silicon oxide films are then removed leaving the silicon nitride films. Impurity ions are then ion-implanted into the main surface of the silicon substrate through the silicon nitride films. Since the silicon nitride films are thicker in the vicinity of the gate electrode and thinner in the vicinity of the source/drain, this process forms extensions penetrating under the gate electrode for a small distance.

18 Claims, 23 Drawing Sheets

SEMICONDUCTOR DEVICE MANUFACTURING METHOD

BACKGROUND OF THE INVENTION

1. Field of the Invention

The present invention relates to a field-effect transistor having an MIS (Metal-Insulator-Semiconductor) structure (hereinafter referred to as "MIS transistor"), and particularly to an MIS transistor having an LDD (Lightly Doped Drain) structure.

2. Description of the Background Art

FIGS. 40 to 44 are sectional views showing a conventional method for manufacturing an MIS transistor in the order of process steps. Ion implantation for well, channel, etc. (not shown) is applied to the area element-isolated by the silicon oxide 2 formed on the main surface of the silicon substrate 1 (hereinafter referred to as "active region") and then a gate insulating film 4 and polysilicon 3 are formed on the silicon substrate 1 in this order. Next impurity ions 6 are implanted into the active region using as a mask the gate insulating film 4 and the polysilicon 3 shaped by lithography technique in the same shape as seen in a plane view. This implantation forms extensions 5 in the LDD structure, which have lower impurity concentration and are relatively thin and located close to the gate electrode, thus providing the structure shown in FIG. 40. The polysilicon 3, which functions as the gate electrode, may be referred to as gate electrode 3 hereinafter.

Next silicon nitride film and silicon oxide film are deposited in this order on the upper surface of the structure shown in FIG. 40. Then the films are etched back to form sidewalls of the silicon oxide films 7 and the silicon nitride films 8 on the sides of the gate electrode 3 (FIG. 41).

Next impurity ions 10 are implanted to form a pair of source/drain 9 in the LDD structure, which have higher impurity concentration and are relatively thick and separated away from the gate electrode 3 (FIG. 42). A thermal process is then applied to electrically activate the impurity introduced in the source/drain 9 by the ion implantation (hereinafter referred to as "drive of source/drain"), thus providing the structure shown in FIG. 43. RTA (Rapid Thermal Annealing) at 900 to 1200° C. for 1 to 60 sec is usually adopted for the drive of the source/drain.

Next so-called salicidation (salicide: self-aligned silicide) process is applied to the structure shown in FIG. 43 to form cobalt silicide 13 and the structure shown in FIG. 44 is thus obtained. The MIS transistor thus obtained undergoes processes for forming interlayer film, interconnections, etc. as required.

What is important for scaling down of the MIS transistor thus manufactured is control of the shape of junctions at the extensions 5. First, forming shallow junctions at the extensions 5 can reduce the effect that the depletion layer extending from the drain part of the source/drain 9 exerts on the source part of the source/drain 9 (short-channel effect).

When the extensions 5 are formed as a pair of an equal depth, the distance We between the pair of extensions 5 (FIG. 44) corresponds to the effective gate length and the characteristics of the MIS transistor are approximately determined by the distance We. Accordingly, even when the physical gate length, or the length Wg of the gate electrode 3 (FIG. 44) is designed equal, the characteristics of the MIS transistor differ depending on the distance We between the extensions 5. The length Wg of the gate electrode 3 is adopted when designing an MIS transistor. Accordingly, in order to achieve agreement of the MIS transistor operation between design and measurement, it is desired that the distance We between the pair of extensions 5 is approximately equal to the length Wg of the gate electrode 3.

In general, the solid solubility of an impurity becomes larger as the temperature becomes higher. Lower temperature in thermal process can only activate impurity concentration determined by the solid solubility. Therefore activating higher impurity concentration requires thermal process at higher temperature. Since the impurity concentration in the extensions 5 is usually lower than that in the source/drain 9, the activation of the extensions 5 does not require such high temperature as the drive of the source/drain 9 does.

In the above-described conventional method for manufacturing MOSFET, however, the drive of the source/drain 9 is performed after the implantation of the impurity ions 6 for the extensions 5 (FIG. 42). Accordingly, since the drive of the source/drain 9 is applied to the extensions 5 as excessive heat, the drive of the source/drain 9 causes the impurity in the extensions 5 to excessively diffuse. FIG. 45 is a graph showing the diffusion in the extensions 5 caused by the drive of the source/drain 9. The thermal processing temperature increases in the order of the curves 81, 82 and 83. This graph shows a tendency that the impurity diffuses deeper from the surface as the thermal processing temperature rises. This tendency is also observed when the thermal processing time is lengthened. That is to say, referring to FIG. 43, the extensions 5 diffuse in the depth direction vertical to the main surface of the silicon substrate 1 and its thickness De becomes larger.

The drive of the source/drain 9 also causes the opposing ends of the pair of extensions 5 to expand in the direction parallel to the main surface of the silicon substrate 1, which increases the amount of overlap, Wo, of the gate electrode 3 and the extensions 5 (FIG. 43). This increases the difference between the effective gate length and the physical gate, which is a disadvantageous factor in design and manufacture of MIS transistors having fine gate length.

Furthermore, the thermal process for obtaining the salicide structure, too, is performed after the implantation of the impurity ions 6. This order of manufacturing steps serves as a factor which reduces the distance We between the pair of extensions 5 as well.

Techniques for applying ion implantation through sidewalls are disclosed in Japanese Patent Application Laid-Open No.6-333943 (1994), Japanese Patent Applicatin Laid-Open No.7-142726 (1995), and Japanese Patent Application Laid-Open No.10-200097 (1998), for example.

SUMMARY OF THE INVENTION

According to a first aspect of the present invention, a semiconductor device manufacturing method comprises the steps of: (a) forming a gate insulating film on a main surface of a semiconductor substrate and a gate electrode on the semiconductor substrate with the gate insulating film interposed therebetween; (b) forming a first sidewall covering a side of the gate electrode and the gate insulating film and the main surface in a first region which extends for a first width from the side outward from the gate electrode; (c) introducing a first impurity into the main surface by using the first sidewall and the gate electrode as a mask to form a first impurity region; (d) applying a thermal process to the structure obtained in the step (c) to electrically activate the first impurity; (e) forming a second sidewall by reducing the thickness of the first sidewall to a thickness smaller than that of the gate electrode, leaving part of the first sidewall which covers the side in a second region extending for a second width from the side outward from the gate electrode, the second width being smaller than the first width; and (f) after the step (d), introducing a second impurity through the second sidewall by using the gate electrode as a mask to form a second impurity region having an impurity concentration lower than that of the first impurity region.

According to the first aspect of the invention, the first sidewall prevents the first impurity from being introduced into the main surface in the first region. However, since the second sidewall is thinner than the first sidewall except in the second region, the second impurity is introduced into the main surface except in the second region. The impurity concentration in the second impurity region is lower than that in the first impurity region, which realizes a so-called LDD structure. Since the step (d) precedes the step (f), the step (f) is not affected by the thermal process in the step (d). Accordingly, the dimensions of the second impurity region can accurately be controlled independently of control of the shape of the first impurity region. Furthermore, the second sidewall prevents the second impurity from being introduced into the main surface in the second region. This alleviates penetration of the second impurity region under the gate electrode.

Preferably, according to a second aspect of the invention, in the semiconductor device manufacturing method, the step (b) comprises the steps of; (b-1) applying thermal nitridation to the side and the main surface to form a nitride film, and (b-2) depositing on the nitride film a material which can be etched more easily than the nitride film.

According to the second aspect of the invention, the step (e) can easily be achieved by etching.

Preferably, according to a third aspect of the present invention, in the semiconductor device manufacturing method, the semiconductor substrate is a silicon substrate and a silicon oxide film is deposited on the nitride film in the step (b-2).

Preferably, according to a fourth aspect of the present invention, in the semiconductor device manufacturing method, the step (b) further comprises a step of (b-3) etching back the nitride film and the silicon oxide film to form the first sidewall and the nitride film etched back in the step (b-3) functions as the second sidewall.

According to the fourth aspect of the invention, the effect of the first aspect is not hindered because the thermal process required for formation of the second sidewall is performed before the step (f).

Preferably, according to a fifth aspect of the invention, the semiconductor device manufacturing method further comprises a step of (g) thickening the semiconductor substrate on the main surface separated from the side of the gate electrode by the first width or more.

Preferably, according to a sixth aspect of the present invention, in the semiconductor device manufacturing method, the step (g) is performed between the step (b) and the step (f).

According to the sixth aspect of the invention, it is possible to manufacture a semiconductor device with raised source/drain structure. Even if the process of thickening the semiconductor substrate needs high-temperature processing, the effect of the first aspect is not hindered because the step (g) is performed before the step (f).

Preferably, according to a seventh aspect of the present invention, in the semiconductor device manufacturing method, the step (g) is performed after the step (c).

Preferably, according to an eighth aspect of the present invention, in the semiconductor device manufacturing method, the step (g) is performed after the step (d).

Preferably, according to a ninth aspect of the present invention, in the semiconductor device manufacturing method, the step (g) is performed after the step (e).

Preferably, according to a tenth aspect of the present invention, in the semiconductor device manufacturing method, epitaxial growth of a semiconductor is performed in the step (g).

Preferably, according to an eleventh aspect of the present invention, in the semiconductor device manufacturing method, in the step (a), top surface of the gate electrode is formed with an insulator which hinders the epitaxial growth of the semiconductor.

According to the eleventh aspect of the invention, the epitaxial growth performed in the step (g) does not cause epitaxial layer to grow on the upper surface of the gate electrode. Also, even if the gate electrode functions as a mask in the introduction of the first impurity in the step (c), the first impurity is introduced into the insulator. Accordingly, the impurity concentration in the gate electrode is not changed and the threshold of the semiconductor device is not affected.

Preferably, according to a twelfth aspect of the present invention, in the semiconductor device manufacturing method, the semiconductor obtained by the epitaxial growth comprises silicon.

Preferably, according to a thirteenth aspect of the present invention, in the semiconductor device manufacturing method, the semiconductor obtained by the epitaxial growth is amorphous.

Preferably, according to a fourteenth aspect of the present invention, in the semiconductor device manufacturing method, the semiconductor obtained by the epitaxial growth further comprises germanium.

Preferably, according to a fifteenth aspect of the invention, the semiconductor device manufacturing method further comprises a step of (g) applying salicidation process to the semiconductor substrate in the main surface separated from the side of the gate electrode by the first width or more.

Preferably, according to a sixteenth aspect of the present invention, in the semiconductor device manufacturing method, the step (g) is performed before the step (f).

According to the sixteenth aspect of the invention, the step (g) is performed prior to the step (f) of forming the extension region, so that the salicidation reaction can occur in the source/drain without hindering the effect of the first aspect.

Preferably, according to a seventeenth aspect of the present invention, in the semiconductor device manufacturing method, in the step (f), ions of the second impurity are implanted obliquely with respect to the normal direction of the main surface.

According to the seventeenth aspect of the invention, the position of the end of the second impurity region can be controlled not only by the second width but also by the angle of ion implantation. This is particularly suitable for applications in which the second sidewall is thick and the impurity in the second impurity region is not activated.

Preferably, according to an eighteenth aspect of the present invention, in the semiconductor device manufacturing method, the second sidewall is composed of stacked layers of a silicon oxide film in contact with the semiconductor substrate and a silicon nitride film provided on the semiconductor substrate with the silicon oxide film interposed therebetween.

The present invention has been made in view of the above-described technical background, and an object of the invention is to provide a method for manufacturing an MIS transistor which can prevent unwanted diffusion of extensions caused by the drive of source/drain and thermal process for obtaining a salicide structure so that the diffusion of the source/drain and the diffusion of the extensions can independently be controlled so as to obtain optimum structures for them.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment:

FIGS. 1 to 8 are sectional views showing, in the order of process steps, an MIS transistor manufacturing method according to a first preferred embodiment of the invention.

Silicon oxide 2 is selectively formed in areas on the main surface of the silicon substrate 1 to section the active region.

Then ions are implanted into the main surface of the silicon substrate 1 to form well, channel, etc. (not shown). In the active region on the main surface of the silicon substrate 1, a gate insulating film 4 is formed with silicon oxide, for example, and a gate electrode 3 of polysilicon is formed above the silicon substrate 1 with the gate insulating film 4 interposed therebetween, which are formed in the same shape as seen in a plane view. This process can be achieved by adopting known photolithography technique and dry etching.

Figure 1:
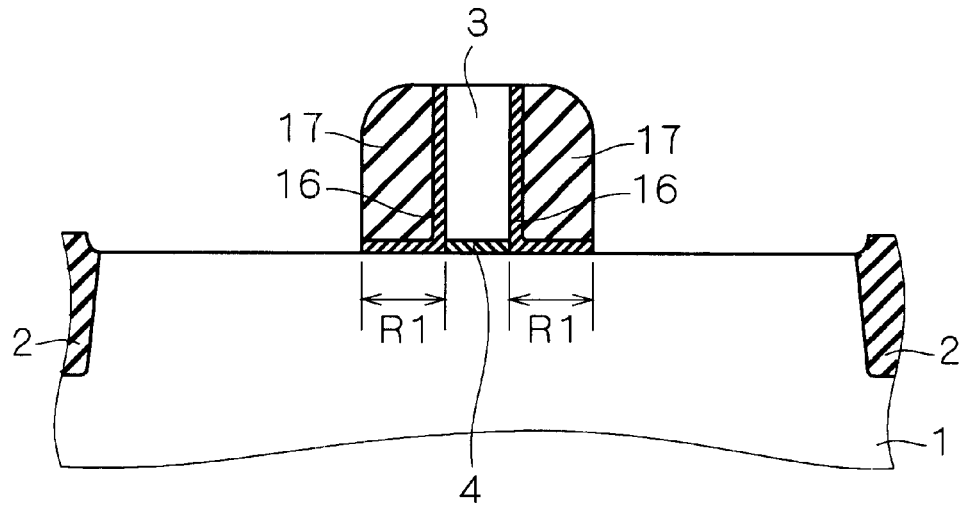
FIGS. 1 to 8 are sectional views showing, in the order of process steps, an MIS transistor manufacturing method according to a first preferred embodiment of this invention.
Figure 2:
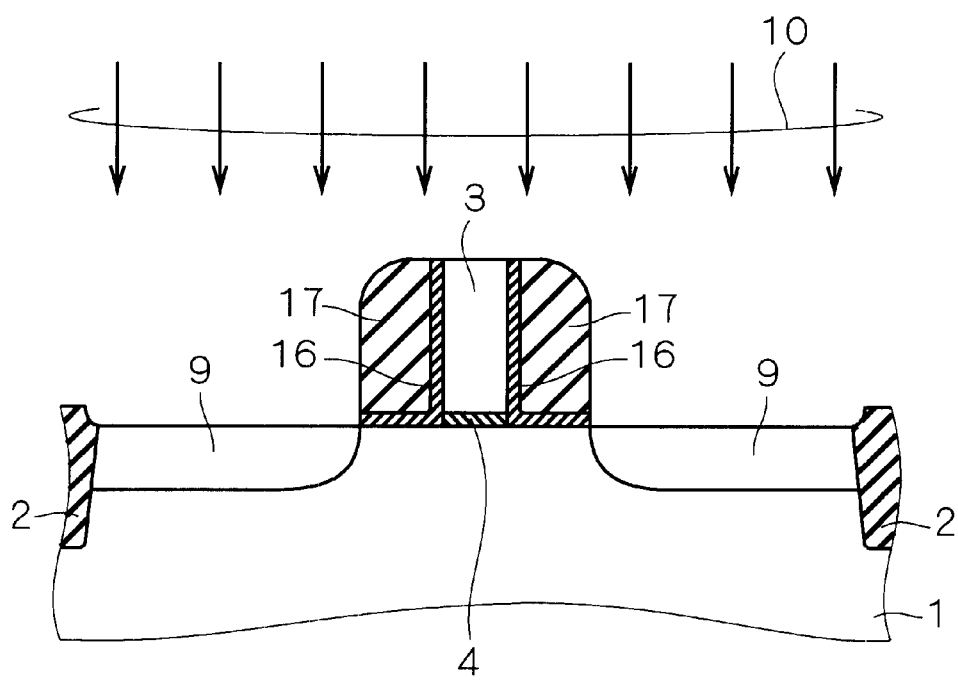

Next first sidewalls are formed, which cover the sides of the gate electrode 3 and the gate insulating film 4 and the main surface of the silicon substrate 1 in first regions R1 extending for a first width outward from these sides. The first sidewalls can be formed by depositing a silicon nitride film and a silicon oxide film in this order to cover the main surface of the silicon substrate 1, the gate electrode 3 and the gate insulating film 4 and then etching back them, for example. That is to say, the first sidewalls are composed of silicon nitride films 16 and silicon oxide films 17 as shown in FIG. 1, for example. The silicon nitride films 16 cover the sides of the gate electrode 3 and the gate insulating film 4 and the main surface of the silicon substrate 1 in the first regions R1 and the silicon oxide films 17 face the sides of the gate electrode 3 and the gate insulating film 4 and the main surface of the silicon substrate 1 in the first regions R1 through the silicon nitride films 16. Such sidewall structure composed of two layers of silicon nitride film and silicon oxide film is disclosed in Japanese Patent Application Laid-Open No.10-200097 (1998), for example.

The silicon nitride films 16 are formed to a thickness of about 1 to 50 nm by CVD, thermal nitridation, etc. The silicon oxide films 17 are formed to a thickness of about 5 to 100 nm. The silicon oxide films 17 can be formed by CVD, thermal oxidation, etc.

Next, by using the first sidewalls, or the silicon nitride films 16 and the silicon oxide films 17, and the gate electrode 3 as a mask, impurity ions 10 are introduced into the main surface of the silicon substrate 1 by ion implantation, for example. This implantation forms a pair of source/drain 9 which face to each other through the silicon substrate 1 located under the silicon nitride films 16, the silicon oxide films 17 and the gate electrode 3, thus providing the structure shown in FIG. 2. Since the thick first sidewalls and gate electrode 3 are used as a mask during introduction of the impurity ions 10, the impurity ions 10 can be introduced deep into the silicon substrate 1 but a very small amount of impurity is introduced into the regions where extensions are formed later. That is to say, it is easy to control the thickness of the source/drain 9 separately from the thickness of the extensions.

Figure 3:
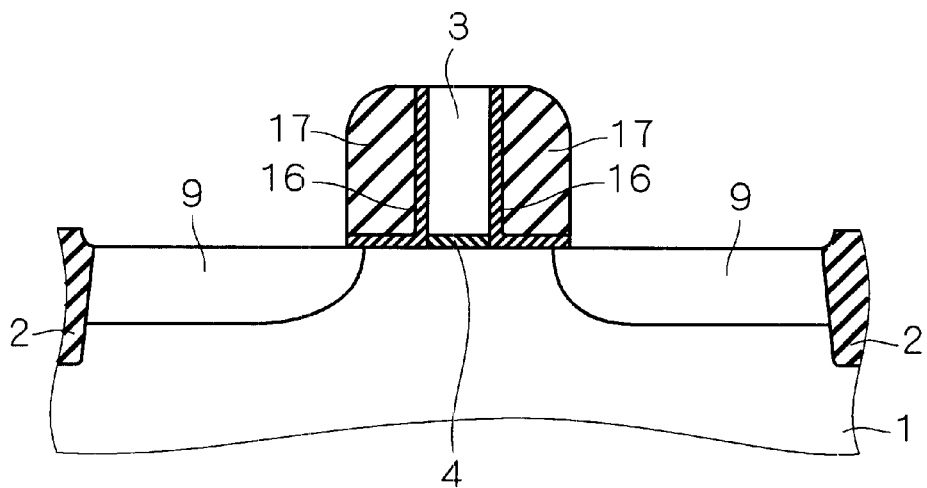

Subsequently, the drive of the source/drain 9 is performed by RTA at about 900 to 1200° C. for about 1 to 60 sec, for example. This may cause the source/drain 9 to slightly expand toward the gate electrode 3 (FIG. 3).

Figure 4:
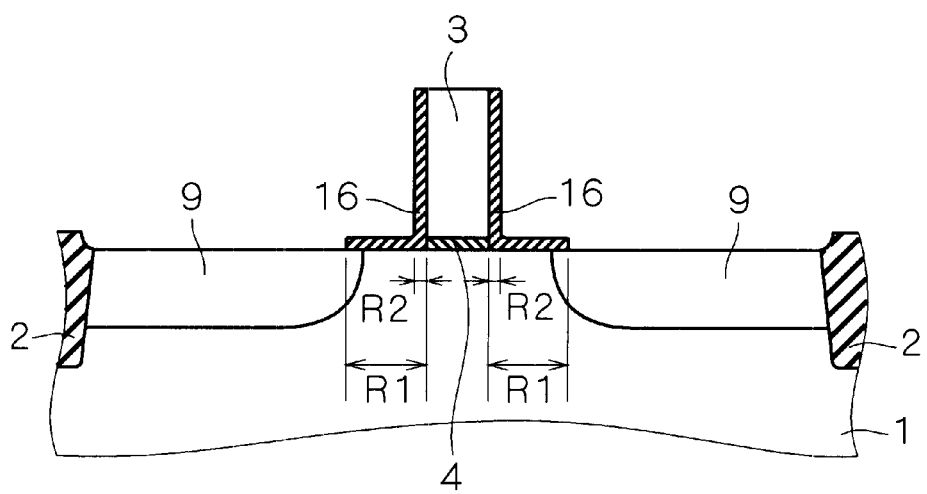

Next the silicon oxide films 17 are removed by buffered HF, HF, dry etching, etc. leaving the silicon nitride films 16 unremoved, and the structure shown in FIG. 4 is thus obtained. The silicon nitride films 16 are left as second sidewalls which cover the sides of the gate electrode 3 and the gate insulating film 4 in the second regions R2 extending for a second width smaller than the first width outward from these sides, and which also cover the first regions R1 on the main surface of the silicon substrate 1, with a thickness smaller than that of the gate electrode 3.

Figure 5:
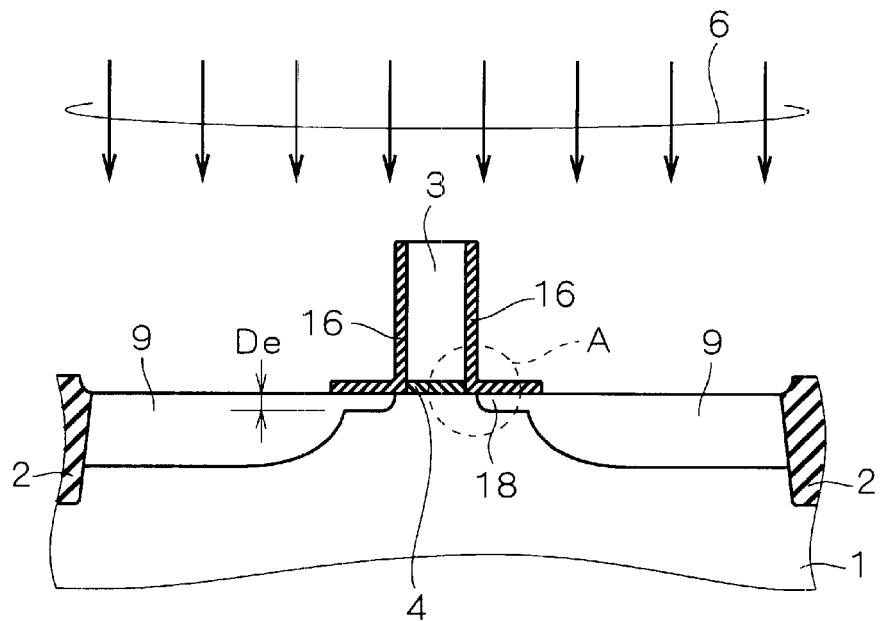
Figure 6:
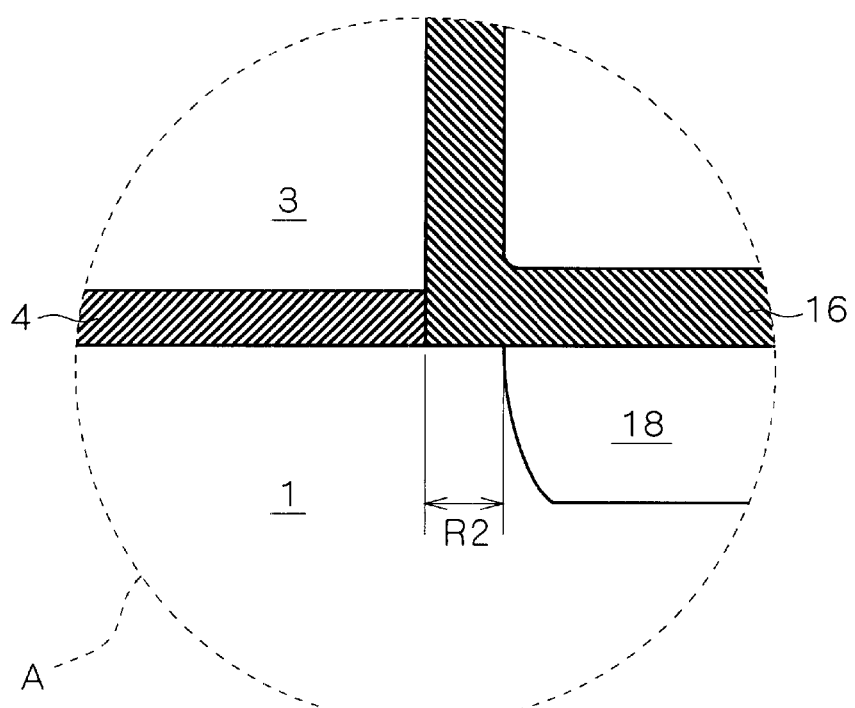

Next impurity ions 6 are introduced, e.g. ion-implanted, through the silicon nitride films 16 as the second sidewalls by using the gate electrode 3 as a mask. This introduction of the impurity ions 6 forms extensions 18, thus providing the structure shown in FIG. 5. FIG. 6 is a sectional view showing the part A in FIG. 5 in an enlarged manner. The part of the silicon nitride film 16 which serves as the mask against the introduction of the impurity ions 6 is thin except in the second region R2, so that the impurity ions 6 are introduced into the main surface of the silicon substrate 1 as in the case of the formation of the source/drain 9. The LDD structure having the extensions 18 can thus be obtained. The position of the junctions can be set in desired position by controlling the thickness of the silicon nitride films 16.

Since the silicon nitride films 16 serving as a mask against the impurity ions 6 have a large thickness in the second regions R2, the impurity ions 6 are not introduced into the main surface of the silicon substrate 1, as in the region right under the gate electrode 3. Or, the peak of the impurity ions 6 is separated from the region right under the gate electrode 3 at least. Hence it is possible to suppress penetration of the extensions 18 into the part under the gate electrode 3. In this case, since the implant energy of the impurity ions 6 is weakened when they pass through the silicon nitride films 16 in the second regions R2, the extensions 18 form shallow junctions with the silicon substrate 1 and exhibit sharp profile at the junctions.

Subsequently, thermal process is applied to electrically activate the impurity in the extensions 18 as needed (which is referred to as "drive of the extensions"). RTA can be adopted for the thermal process under conditions of about 900 to 1200° C. for 1 to 60 sec, which are approximately the same as those in the drive of the source/drain 9. However, since the impurity concentration in the extensions 18 is lower than that in the source/drain 9, the drive to the extensions 18 can usually be done at lower temperature or for a shorter time than the drive to the source/drain 9.

The drive to the extensions 18 may be achieved by a thermal process performed after the implantation of the impurity ions 6, such as a thermal process performed in salicidation described later or in interlayer insulating film formation, in which case, of course, the drive to the extensions 18 does not have to be performed separately.

Figure 7:
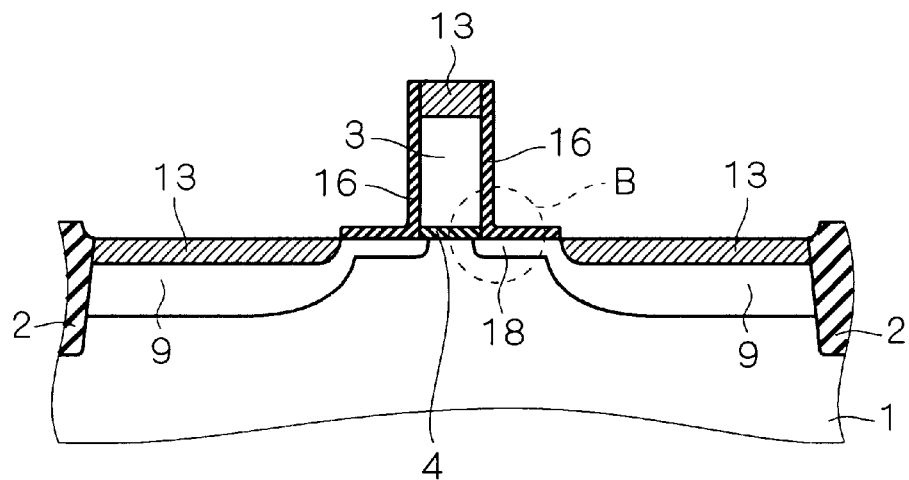

The structure obtained as described above can undergo the same processes as conventional MIS transistors. Cobalt is deposited on the upper surface of the structure shown in FIG. 5 and thermal process is performed in an atmosphere of nitrogen, inert-gas such as argon, etc., which causes the cobalt and silicon to react to form cobalt silicide 13. Then cobalt remaining unreacted in regions where cobalt and silicon are not in contact is removed and the structure shown in FIG. 7 is obtained. Silicidation reaction occurs in the areas exposed in FIG. 5, that is, on the surface of the polysilicon 3 serving as the gate electrode and the surface of the silicon substrate 1 in which the impurity ions 6 and 10 have been introduced, thus providing a so-called salicide structure. Processes such as formation of interlayer film, interconnections, etc. are applied to the MIS transistor thus obtained, as needed.

Figure 8:
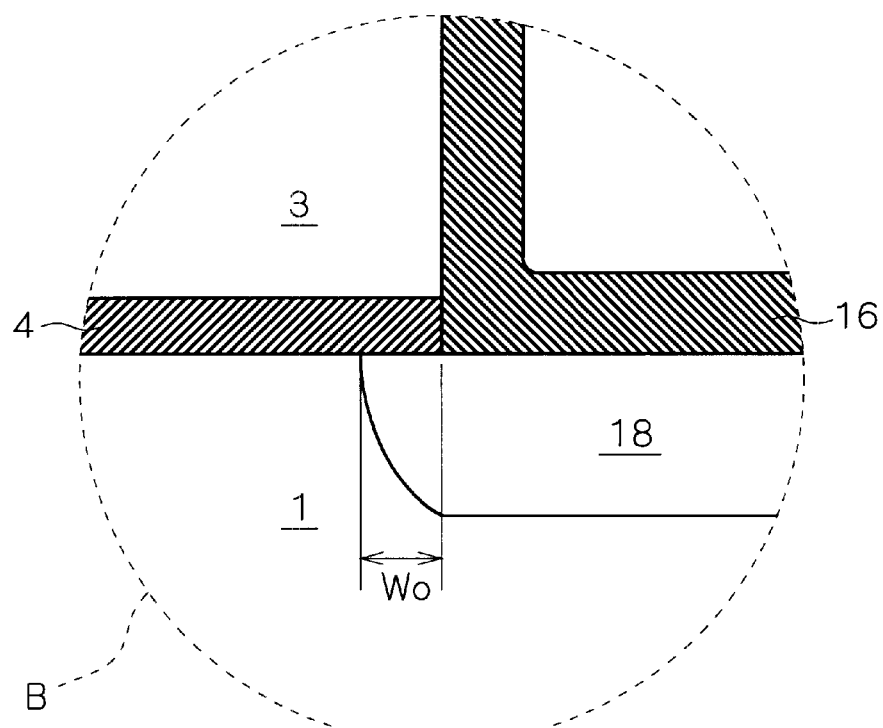

In the above-described manufacturing method, the implantation of impurity ions 6 for the extensions 18 is performed after the drive to the source/drain 9. Therefore no extra thermal process is applied to the extensions 18 and the junctions can be formed shallower. The drive to the extensions 18 or the thermal process in salicidation process causes the extensions 18 to somewhat expand. FIG. 8 is a sectional view showing the part B in FIG. 7 in an enlarged manner. The extensions 18 may penetrate under the gate electrode 3 by the amount of overlap Wo during the thermal process in salicidation. As already stated, however, the amount of overlap Wo is not affected by the drive of the source/drain 9, so that the amount of overlap Wo is not unnecessarily increased. The amount of overlap Wo can be controlled separately from the thickness of the source/drain 9, which allows the dimensions of the extensions 18 to be accurately controlled.

So-called pocket implantation may be adopted in fine MIS transistors, in which an impurity of the same type as the channel is implanted around the extensions 18 to suppress the short-channel effect. In this invention, the pocket implantation can be performed before formation of the first sidewalls, before/after the introduction of the impurity ions 10, or before/after the introduction of the impurity ions 6.

So-called dual-gate structure may be adopted in fine MIS transistors, in which, in nMOS and pMOS, impurities of different types are introduced into the polysilicon forming the gate electrode 3. The present invention is applicable to the dual-gate structure. That is to say, ions may be implanted into the polysilicon before etching the polysilicon to form the gate electrode 3, or ions may be implanted into the gate electrode 3 with the impurity ions 10. A technique for etching the polysilicon to form a gate electrode after implanting ions into the polysilicon is disclosed in Japanese Patent Application Laid-open No.8-186257 (1996), for example.

The silicon nitride films 16 may be formed as a double-layer structure of silicon oxide film/silicon nitride film. In this case, it is preferred that the silicon oxide film side is in contact with the silicon substrate 1. This enables manufacture of more reliable MIS transistors, since silicon oxide film causes smaller stress than silicon nitride film. The silicon oxide film in this double-layer structure can be formed by CVD, thermal oxidation, etc. similarly to the silicon oxide film 17.

The effect of this preferred embodiment is not hindered when the silicon nitride films 16 are formed by thermal nitridation of the gate electrode 3 and the gate insulating film 4, since the necessary thermal process is performed prior to the process of forming the extensions 18.

Second Preferred Embodiment:

Japanese Patent Application Laid-Open No.63-142677 (1988) and Japanese Patent Application Laid-Open No.4-350942 (1992), for example, disclose techniques of forming a semiconductor layer having a surface raised from the original main surface of the semiconductor substrate, in which after formation of the gate insulating film on the semiconductor substrate, epitaxial growth is applied to the semiconductor substrate around the gate insulating film. The present invention is applicable also to such MIS transistors with raised source/drain structure manufactured as stated above.

FIGS. 9 to 16 are sectional views showing in the order of process steps a method for manufacturing an MIS transistor according to a second preferred embodiment of the invention. Similarly to the first preferred embodiment, silicon oxide 2 is formed on the main surface of the silicon substrate 1 to section the active region. Then ion implantation (not shown) is performed for well, channel, etc. Subsequently a silicon oxide film 4a for the gate insulating film 4 and a polysilicon film 3a for the gate electrode 3 are deposited in this order.

Figure 9:
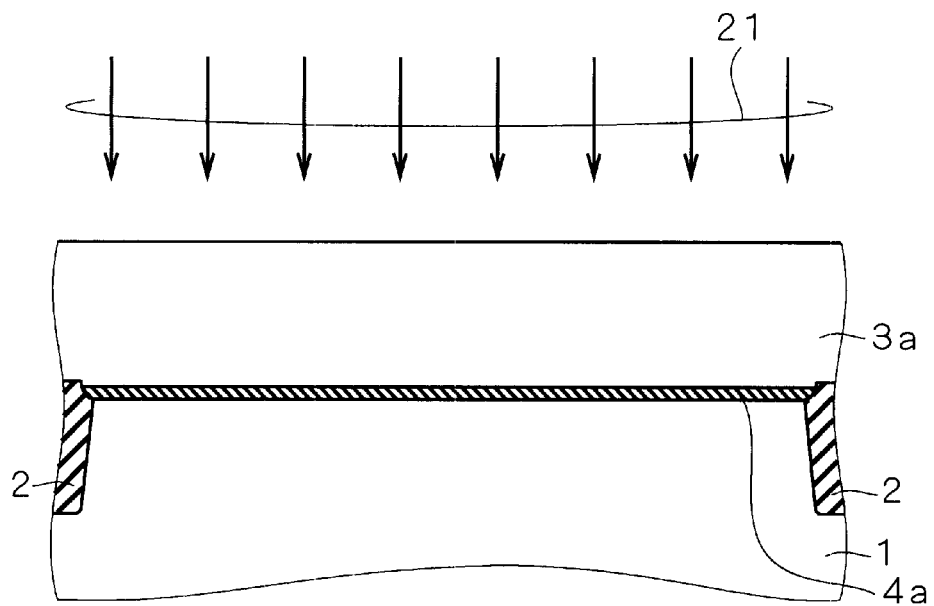
FIGS. 9 to 16 are sectional views showing, in the order of process steps, an MIS transistor manufacturing method according to a second preferred embodiment of this invention.

Impurity ions 21 are then introduced, e.g. ion-implanted, into the polysilicon film 3a from its surface (FIG. 9). For the impurity ions 21, an n-type impurity is applied to a region for the gate electrode of an n-type transistor and a p-type impurity is applied to a region for the gate of a p-type transistor, in order to appropriately set the threshold of the MIS transistor. Needless to say, the ion implantation of the impurity ions 21 is not necessary when an impurity has been previously introduced in the polysilicon film 3a.

Figure 10:
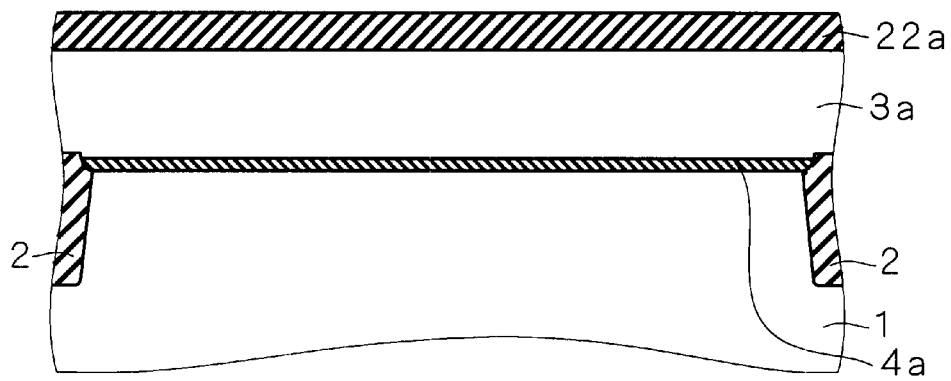
Figure 11:
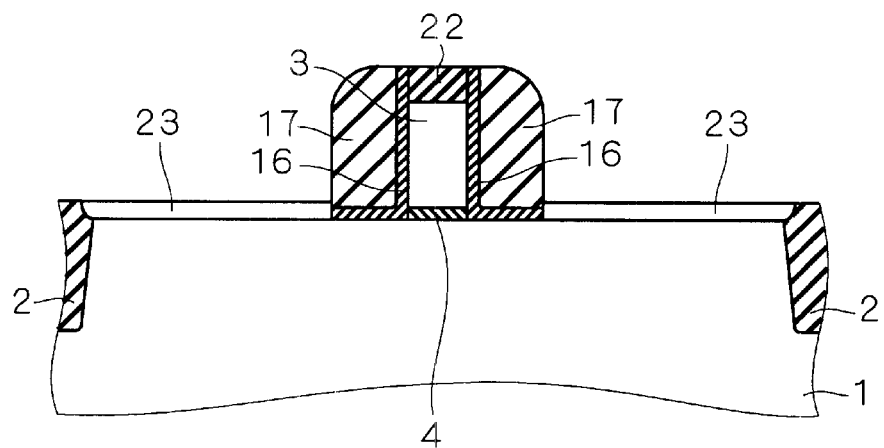

Next a silicon oxide film 22a is deposited by CVD etc. on the polysilicon film 3a to obtain the structure shown in FIG. 10. They, by known photolithography and dry etching, the structure of the gate insulating film 4, gate electrode 3 and cap layer 22 stacked in this order on the silicon substrate 1 is formed in the same shape as seen in a plane view. Then a silicon nitride film and a silicon oxide film are deposited in this order to cover the main surface of the silicon substrate 1 and the stacked structure of the gate insulating film 4, gate electrode 3 and cap layer 22. The structure is then etched back to form the first sidewalls made of the silicon nitride films 16 and the silicon oxide films 17 (FIG. 11). Note that the first sidewalls cover not only the gate electrode 3 but also the sides of the cap layer 22.

Next epitaxial growth of silicon is done under a condition having selectivity with respect to silicon oxide. This process forms epitaxial layers 23 around the first sidewalls on the main surface of the silicon substrate 1, without causing silicon to grow on the silicon oxide 2, silicon oxide films 17 and cap layer 22, thus providing the structure shown in FIG. 11. The surfaces of the epitaxial layers 23 are raised from the original surface of the silicon substrate 1.

The epitaxial growth of silicon is achieved by CVD or MBE. Unlike common CVD, in order to obtain selectivity with respect to silicon oxide, a surface treatment is performed at temperature as high as 800 to 1100° C. in a vacuum or in hydrogen and the epitaxial growth itself is performed at temperature of 500 to 900° C. However, since neither the extensions nor source/drain has been formed yet, such temperature rise does not function as drive to the extensions and source/drain.

Figure 12:
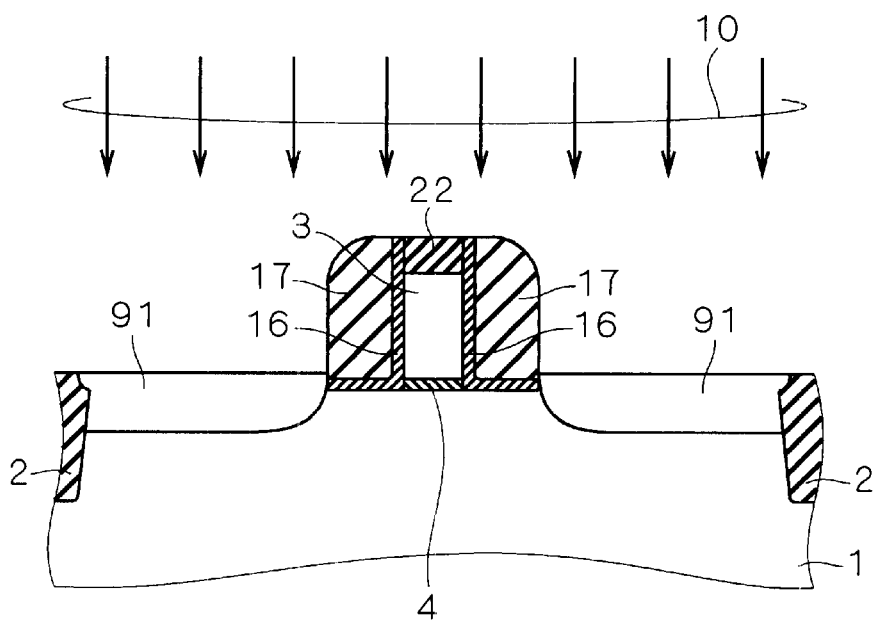
Figure 13:
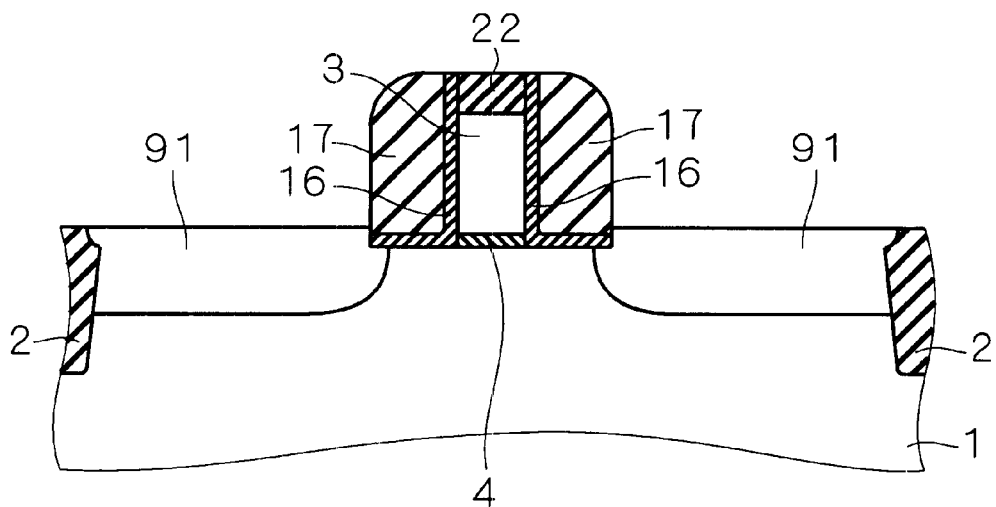

Next impurity ions 10 are introduced, e.g. ion-implanted, to the structure shown in FIG. 11 from the surface of the epitaxial layers 23. The process forms the source/drain 91 in the main surface of the silicon substrate 1 including the epitaxial layers 23, and the structure shown in FIG. 12 is thus obtained. In this process, the cap layer 22 prevents the impurity ions 10 from entering the gate electrode 3. Even if the impurity ions 10 are introduced into the cap layer 22 which is an insulator, the threshold of the MIS transistor is controlled by the impurity ions 21, without being affected by the impurity ions 10. The source/drain 91 are then driven, which causes the source/drain 91 to expand (FIG. 13). This driving is performed in the same conditions as the driving to the source/drain 9.

Figure 14:
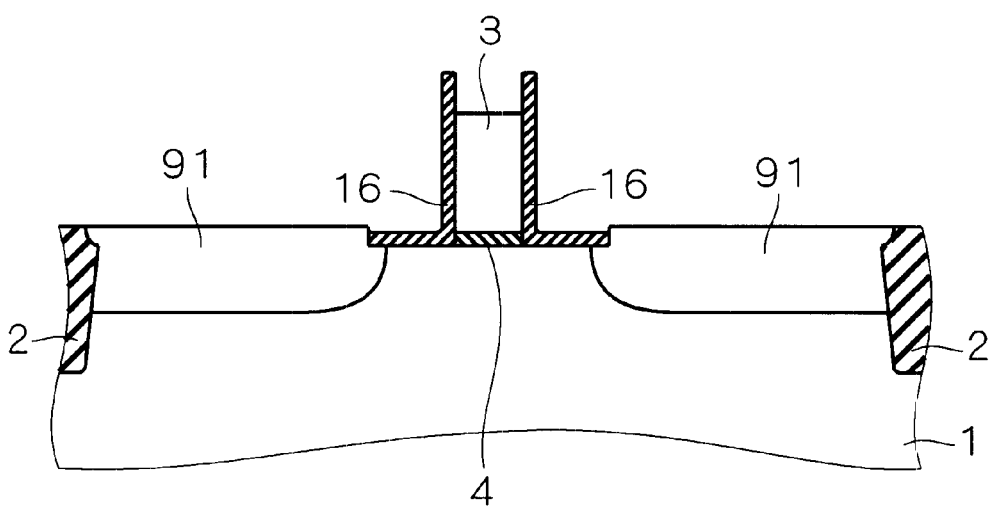
Figure 15:
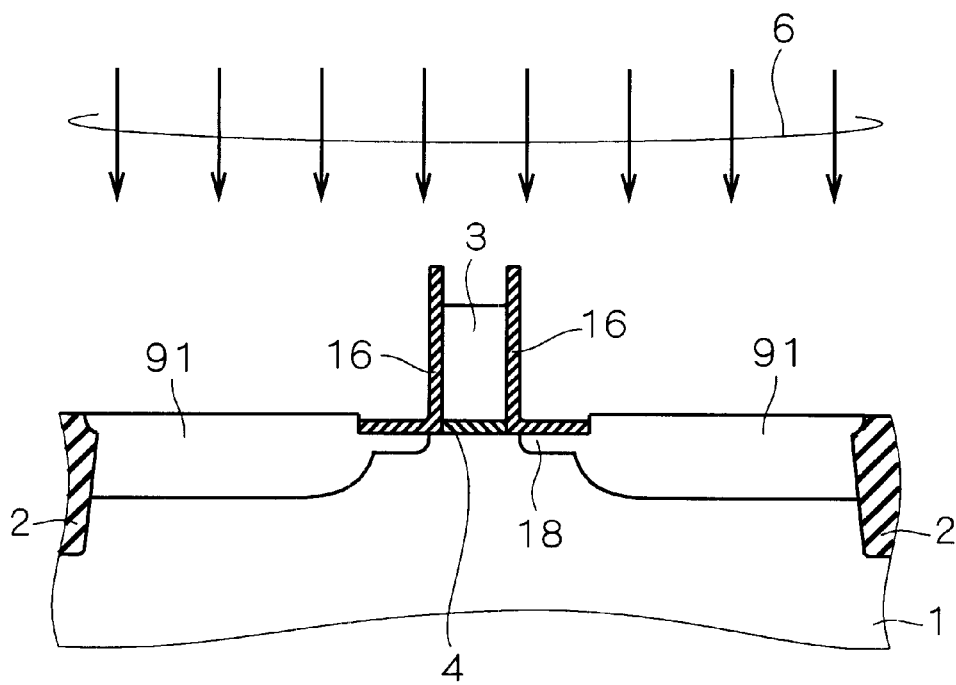
Figure 16:
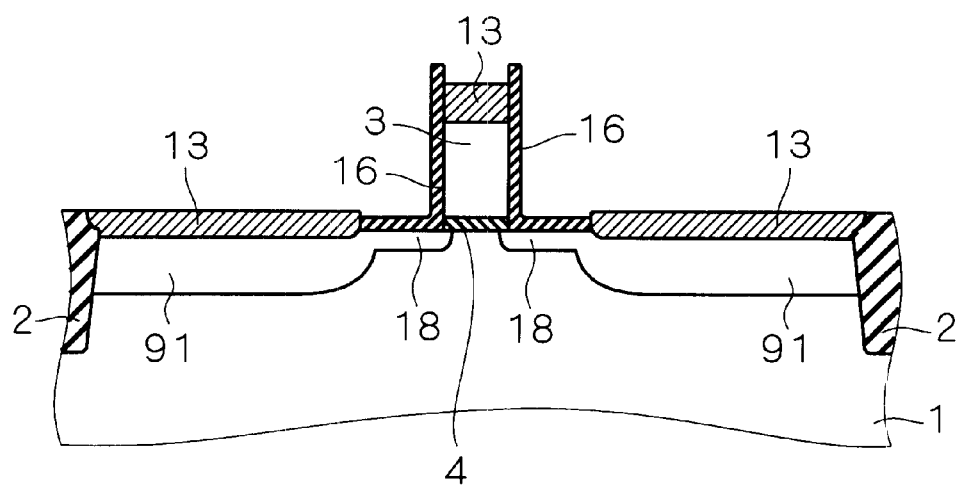

Next, the silicon oxide films 17 are removed by buffered HF, HF, dry etching, etc., leaving the silicon nitride films 16 as the second sidewalls, thus providing the structure shown in FIG. 14. The cap layer 22 is removed in this process, too.

Next, by using the gate electrode 3 as a mask, impurity ions 6 are introduced by ion implantation, for example, through the silicon nitride films 16 as the second sidewalls. The application of the impurity ions 6 forms the extensions 18 and thus provides the structure shown in FIG. 15. Thus, as in the first preferred embodiment, the amount of overlap Wo of the extensions 18 and the gate electrode 3 can be suppressed and the extensions 18 form shallow junctions with the silicon substrate 1.

The extensions 18 are subjected to drive as needed. Then salicidation process is applied to the structure shown in FIG. 15 to form cobalt silicide 13, resulting in the structure shown in FIG. 16. As stated in the first preferred embodiment, of course, the thermal process in salicidation may be utilized to drive the extensions 18.

The epitaxial layers 23 do not necessarily have to be crystalline silicon, but it can be amorphous silicon or germanium, or a mixture of silicon and germanium. As stated in the first preferred embodiment, the second sidewalls can be a double-layer structure of silicon oxide film and silicon nitride film.

Third preferred Embodiment:

This preferred embodiment too shows application of the invention to an MIS transistor with raised source/drain structure. However, in this preferred embodiment, unlike the second preferred embodiment, the process step of introducing impurity into the gate electrode is achieved by the introduction of impurity ions for the source/drain formation.

FIGS. 17 to 22 are sectional views showing in the order of process steps a method for manufacturing an MIS transistor according to a third preferred embodiment of the invention. The structure shown in FIG. 1 is obtained as explained in the first preferred embodiment. In the process of etching back the silicon oxide film to form the first sidewalls, the silicon oxide film is etched away so that it will not remain on the top surface of the gate electrode 3.

Figure 17:
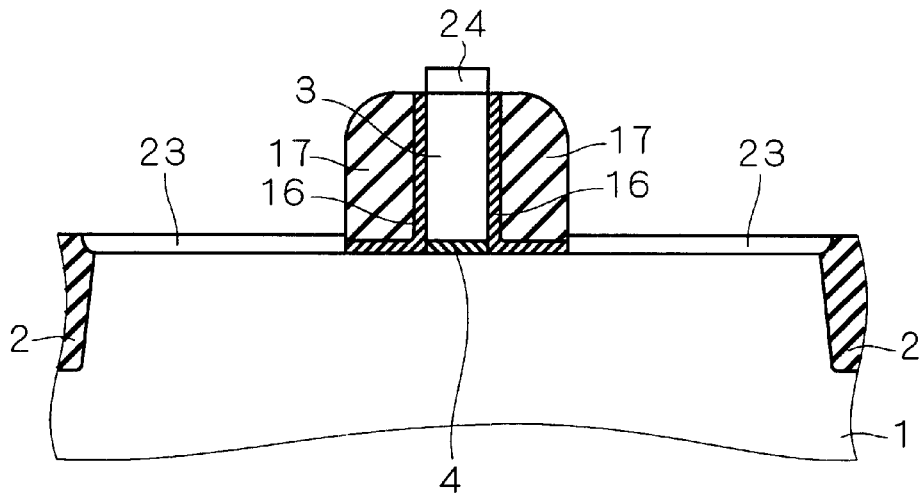
FIGS. 17 to 22 are sectional views showing, in the order of process steps, an MIS transistor manufacturing method according to a third preferred embodiment of this invention.
Figure 18:
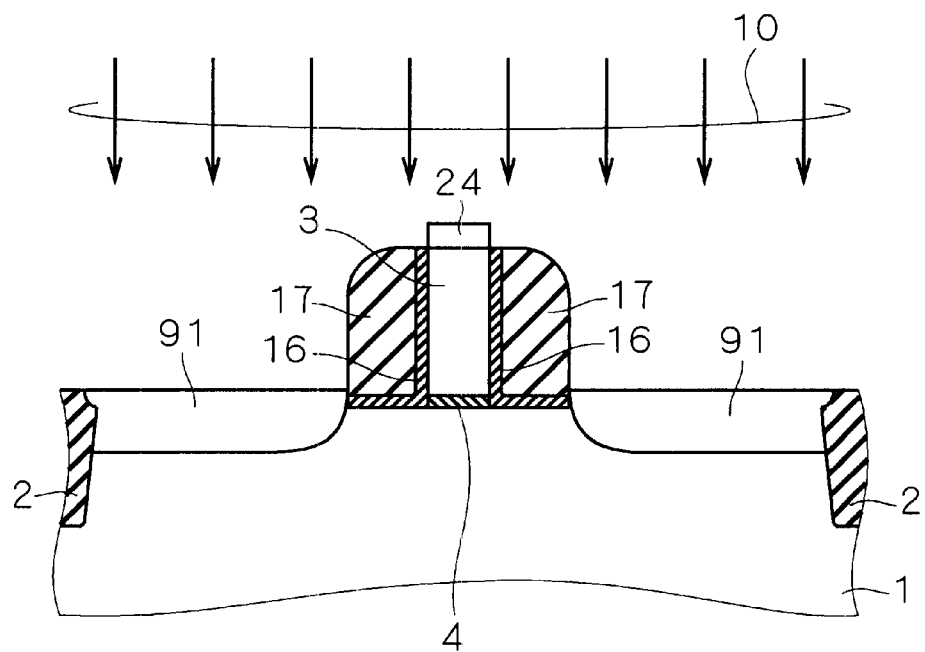

Next epitaxial growth of silicon is applied by CVD or MBE under a condition having selectivity with respect to silicon oxide. This process forms epitaxial layers 23 and 24 respectively on the main surface of the silicon substrate 1 around the first sidewalls and on the gate electrode 3, without causing silicon to grow on the silicon oxide 2 and on the silicon oxide films 17. The structure shown in FIG. 17 is thus obtained. The surface of the epitaxial layers 23 is higher than the original main surface of the silicon substrate 1.

Impurity ions 10 are then introduced, e.g. ion-implanted, into the structure shown in FIG. 17 from the surface of the epitaxial layers 23. This process forms the source/drain 91 in the main surface of the silicon substrate 1 including the epitaxial layers 23, thus providing the structure shown in FIG. 18. In this process, the impurity of the same conductivity type as the source/drain 91 is introduced into the gate electrode 3 including the epitaxial layer 24, so this method is suitable for manufacture of a dual-gate MIS transistor and setting of its threshold.

Figure 19:
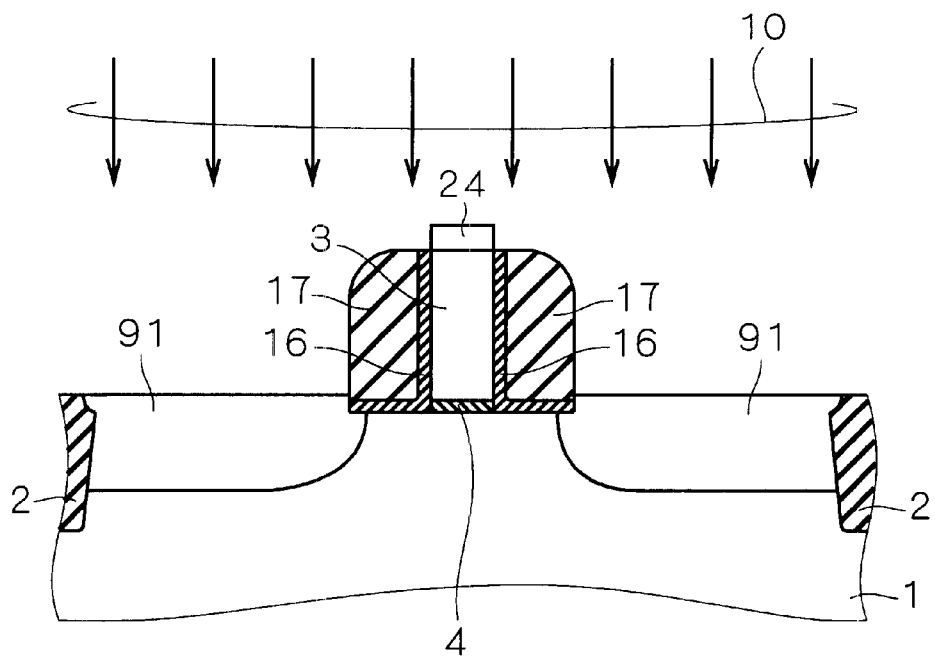
Figure 20:
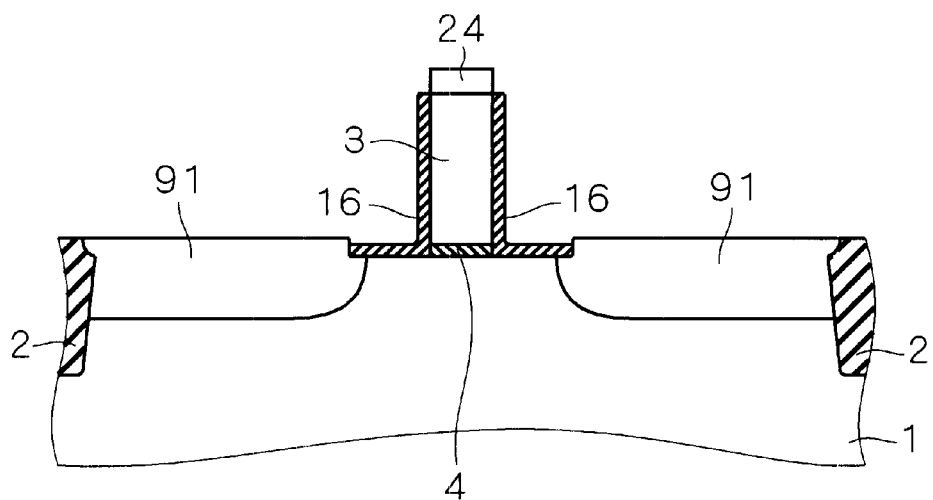
Figure 21:
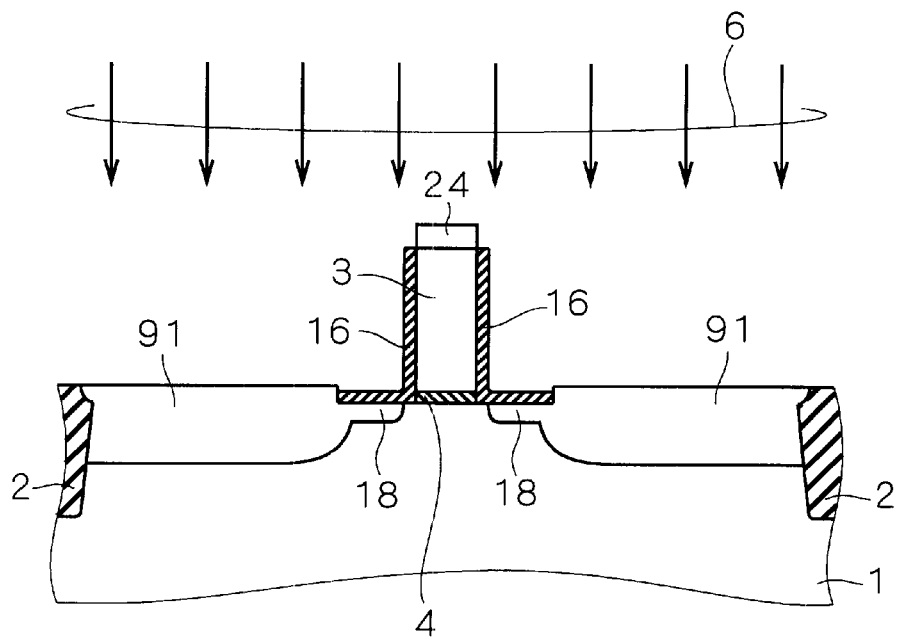
Figure 22:
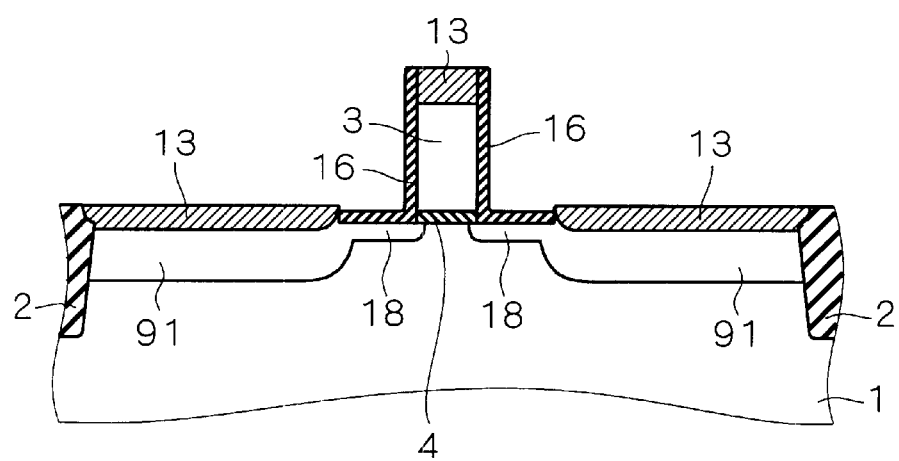

Then drive to the source/drain 91 is done and the source/drain 91 expand (FIG. 19). The silicon oxide films 17 are then removed by buffered HF, HF, dry etching, etc., leaving the silicon nitride films as the second sidewalls, thereby obtaining the structure shown in FIG. 20.

Impurity ions 6 are then introduced by, e.g. ion implantation, through the silicon nitride films 16 as the second sidewalls by using the epitaxial layer 24, and perhaps the gate electrode 3, as a mask. The application of the impurity ions 6 forms the extensions 18 and thus provides the structure shown in FIG. 21. Accordingly, as in the first preferred embodiment, the amount of overlap Wo of the extensions 18 with the gate electrode 3 can be suppressed and the extensions 18 form shallow junctions with the silicon substrate 1.

Although the impurity of the same conductivity type as the extensions 18 is introduced to the epitaxial layer 24 or also to the gate electrode 3, it does not exert considerable effect on the setting of the threshold of the MIS transistor, since the conductivity type of the extensions 18 is usually the same as that of the source/drain 91 and the ion implantation for the extensions 18 is shallower and has lower concentration than the ion implantation for the source/drain 91.

Subsequently drive is applied to the extensions 18 as required. Salicidation process is then applied to the structure shown in FIG. 21 to form cobalt silicide 13, thereby providing the structure shown in FIG. 22. Needless to say, as stated in the first preferred embodiment, the thermal process in salicidation can be utilized also as the driving of the extensions 18.

Although the first and second, and this preferred embodiments have shown examples in which polysilicon is used as the material of the gate electrode 3, metal or a stacked structure of polysilicon and metal can be adopted. Needless to say, in this preferred embodiment and the first preferred embodiment, polysilicon that contains impurities can be adopted as the material of the gate electrode 3.

Fourth Preferred Embodiment:

In the first to third preferred embodiments, the salicidation process is performed after the impurity ions 6 have been introduced for formation of the extensions 18. However, the manufacturing method can be done in such a way that the thermal process in salicidation does not affect the extensions 18.

Figure 23:
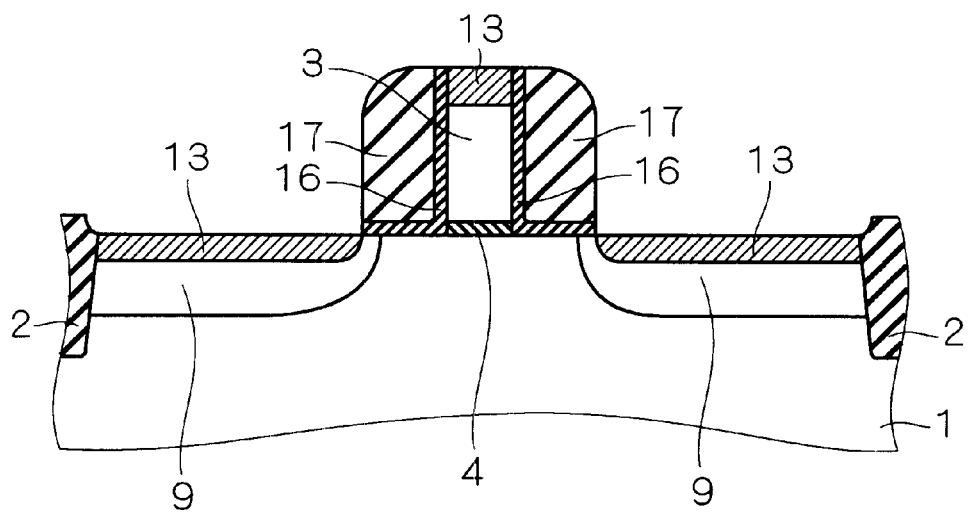
FIGS. 23 to 25 are sectional views showing, in the order of process steps, an MIS transistor manufacturing method according to a fourth preferred embodiment of this invention, which is based on the first preferred embodiment.
Figure 24:
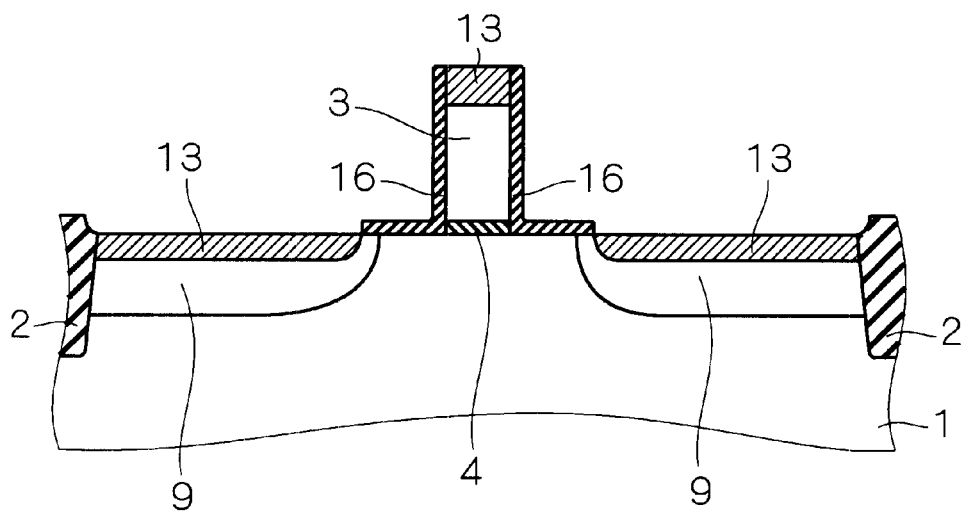
Figure 25:
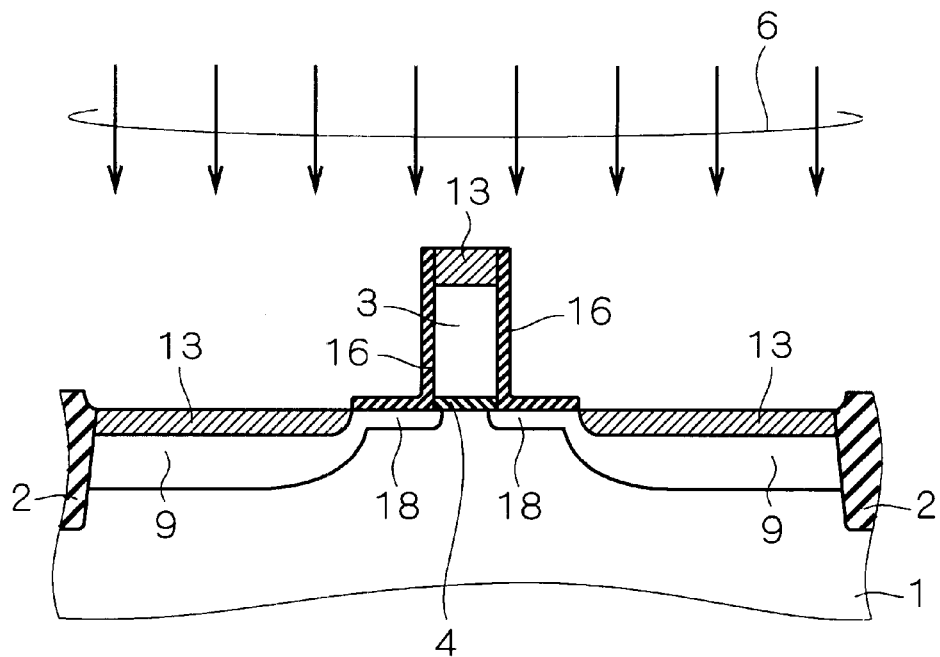

FIGS. 23 to 25 are sectional views showing, in the order or process steps, a method for manufacturing an MIS transistor according to a fourth preferred embodiment, which is based on the first preferred embodiment. The salicidation process is applied to the structure shown in FIG. 3 to obtain the structure shown in FIG. 23. Or, the salicidation process is applied to the structure shown in FIG. 2 and its thermal process can be utilized as the drive to the source/drain 9.

As well as the silicon nitride films 16, the cobalt silicide 13 also has etching resistance to buffered HF and HF. Hence, the structure shown in FIG. 24 can be obtained by applying etching using such etchants to the structure shown in FIG. 23 and removing the silicon oxide films 17, leaving the silicon nitride films 16 as the second sidewalls.

The impurity ions 6 are then introduced, e.g. ion-implanted, from the surface of the structure of FIG. 24, thus introducing the impurity ions 6 into the main surface of the silicon substrate 1 through the silicon nitride films 16, so as to form the extensions 18 (FIG. 25).

Figure 26:
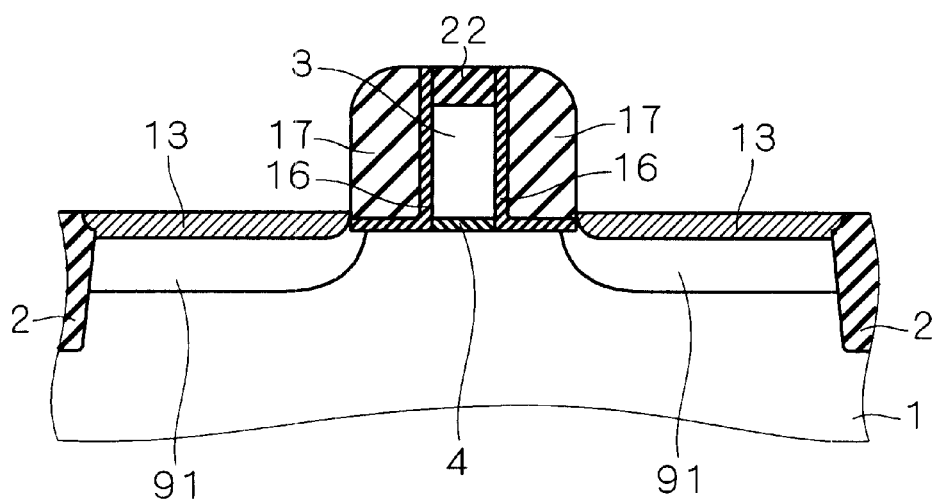
FIGS. 26 to 28 are sectional views showing, in the order of process steps, the MIS transistor manufacturing method according to the fourth preferred embodiment of this invention, which is based on the second preferred embodiment.
Figure 27:
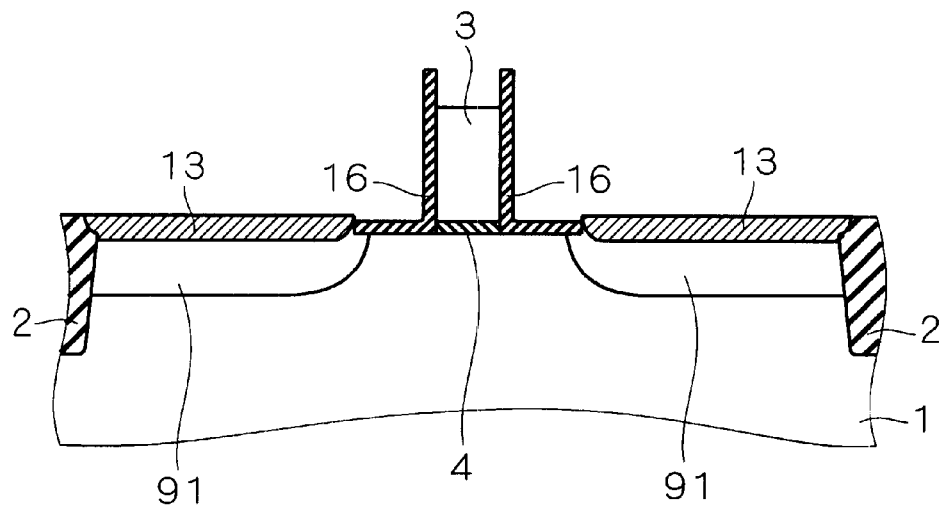
Figure 28:
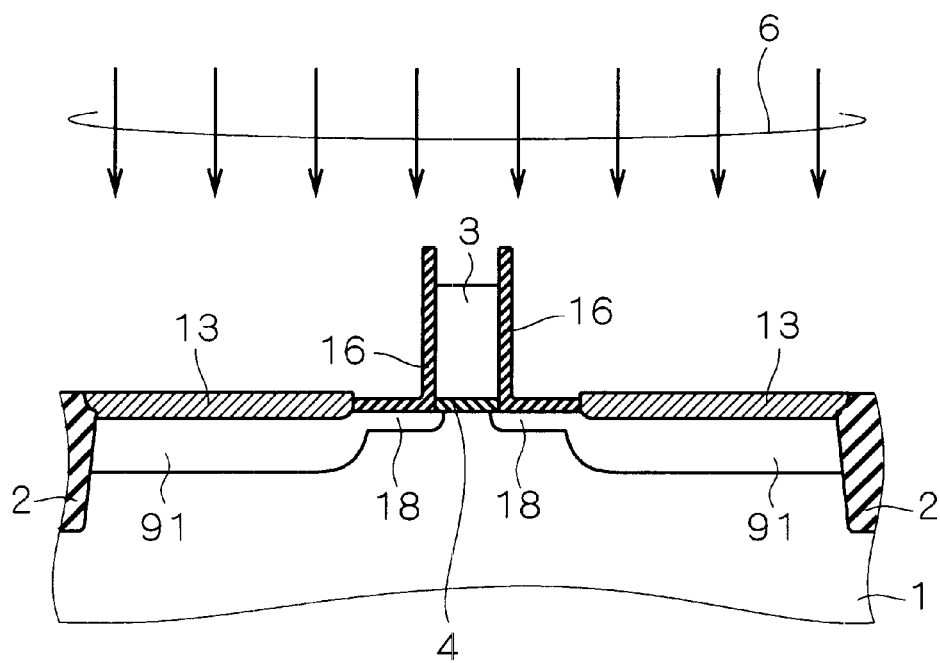

FIGS. 26 to 28 are sectional views showing, in the order of process steps, a method for manufacturing an MIS transistor according to the fourth preferred embodiment, which is based on the second preferred embodiment. The structure of FIG. 26 is obtained by applying the salicidation process to the structure shown in FIG. 13. Or the salicidation process may be applied to the structure shown in FIG. 12 and its thermal process can be utilized as the drive to the source/drain 91.

Then the silicon oxide films 17 are removed by etching using buffered HF or HF, leaving the silicon nitride films 16 as the second sidewalls, which provides the structure shown in FIG. 27. Note that the cap layer 22 too is removed in this process.

The impurity ions 6 are then introduced, e.g. ion-implanted, from the surface of the structure shown in FIG. 27 to introduce the impurity ions 6 into the main surface of the silicon substrate 1 through the silicon nitride films 16, thereby forming the extensions 18 (FIG. 28). In this process, the impurity of the same conductivity type as the extensions 18 can be introduced also into the gate electrode 3.

Figure 29:
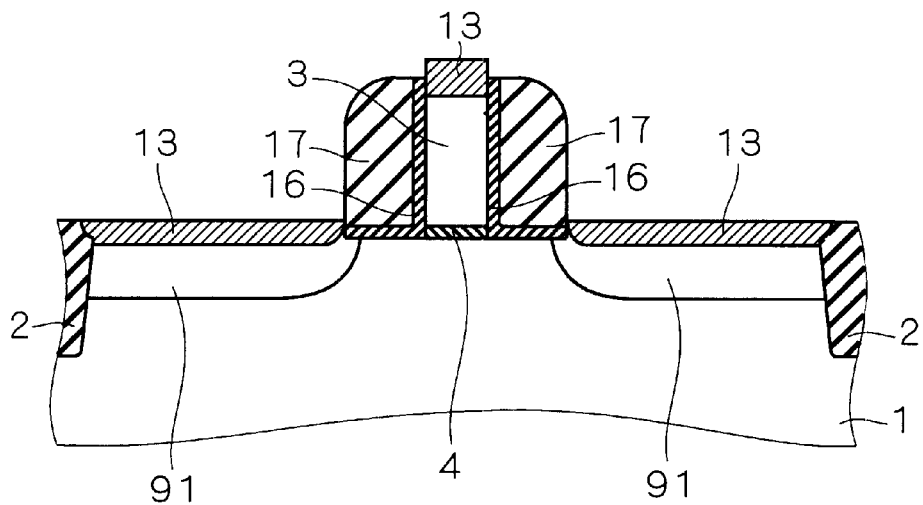
FIGS. 29 to 31 are sectional views showing, in the order of process steps, the MIS transistor manufacturing method according to the fourth preferred embodiment of this invention, which is based on the third preferred embodiment.
Figure 30:
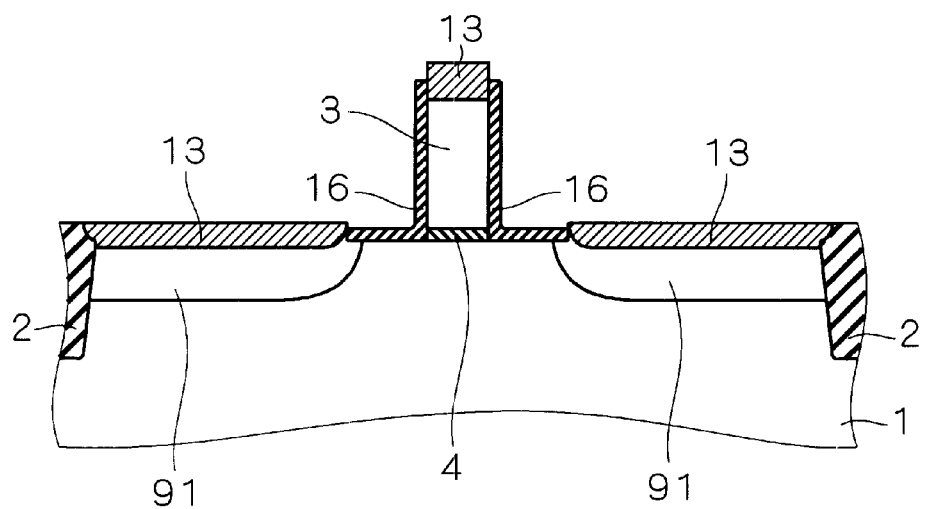
Figure 31:
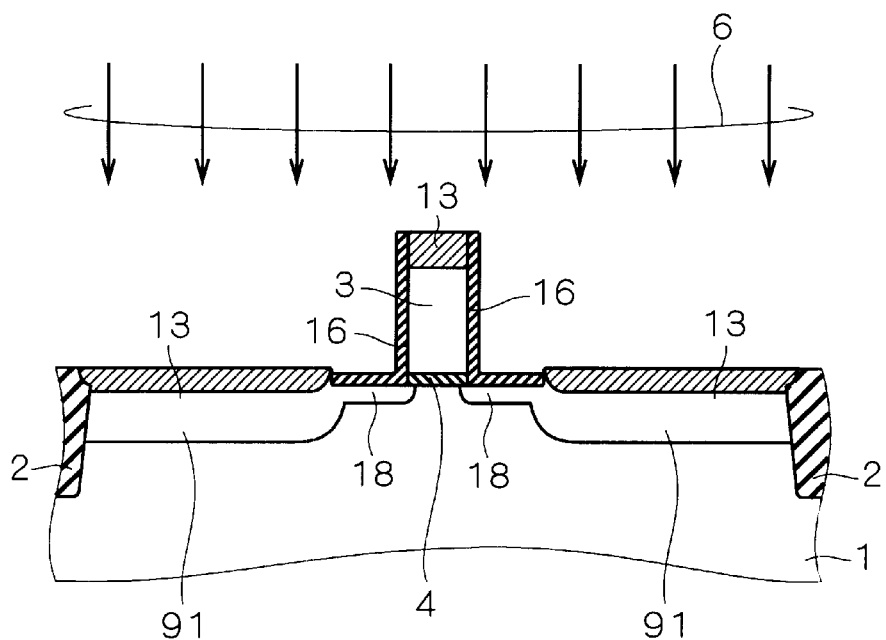

FIGS. 29 to 31 are sectional views showing, in the order of process steps, a method for manufacturing an MIS transistor according to the fourth preferred embodiment, which is based on the third preferred embodiment. The salicidation process is applied to the structure shown in FIG. 19 to obtain the structure shown in FIG. 29. Or the salicidation process may be applied to the structure shown in FIG. 18 and the thermal process can be utilized as the drive to the source/drain 91.

The silicon oxide films 17 are then removed by etching using buffered HF or HF, leaving the silicon nitride films 16 as the second sidewalls, which provides the structure shown in FIG. 30.

Then the impurity ions 6 are introduced, e.g. ion-implanted, from the surface of the structure shown in FIG. 30 and then the impurity ions 6 are introduced onto the main surface of the silicon substrate 1 through the silicon nitride films 16, which forms the extensions 18 (FIG. 31). In this process, the impurity of the same conductivity type as the extensions 18 is introduced also into the gate electrode 3, but it does not considerably affect the threshold of the MIS transistor, as stated in the third preferred embodiment.

Needless to say, the various modifications already explained, such as the application of the double-layer structure to the second sidewalls, can be applied to the examples of this preferred embodiment.

Fifth Preferred Embodiment:

In manufacture of an MIS transistor with raised source/drain structure as shown in the second and third preferred embodiments, the formation of the epitaxial layers 23 can be achieved in various stages.

Figure 32:
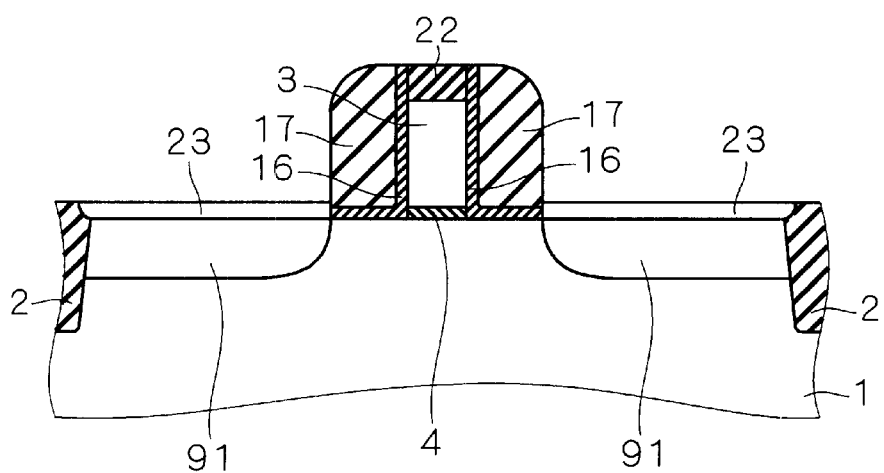
FIGS. 32 to 34 are sectional views showing an MIS transistor manufacturing method according to a fifth preferred embodiment of this invention, which is based on the second preferred embodiment.
Figure 33:
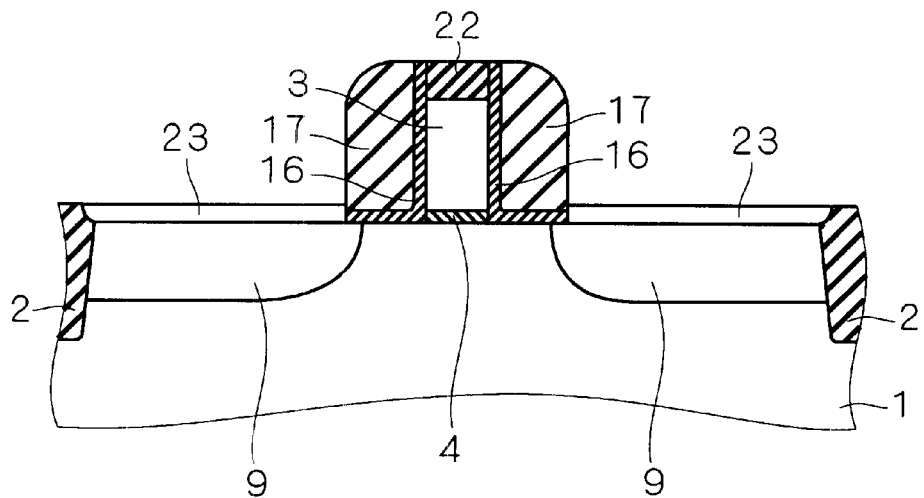
Figure 34:
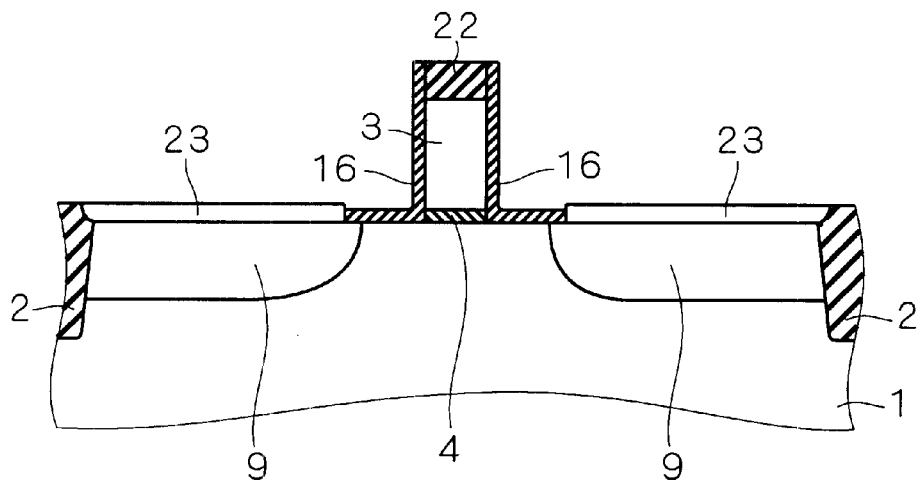

FIGS. 32 to 34 are sectional views showing methods for manufacturing an MIS transistor according to a fifth preferred embodiment, which are based on the second preferred embodiment. FIG. 32 shows an example in which the epitaxial growth is applied to form the epitaxial layers 23 after the impurity ions 10 for the source/drain 91 have been introduced. FIG. 33 shows an example in which the epitaxial growth is applied to form the epitaxial layers 23 after the impurity ions 10 for the source/drain 91 have been introduced and the source/drain 91 have been driven. In FIG. 33, as compared with FIG. 32, the source/drain 91 are somewhat extended by the driving. FIG. 34 shows an example in which the epitaxial growth is applied to form the epitaxial layers 23 after the silicon oxide films 17 have been removed from the first sidewalls.

Figure 35:
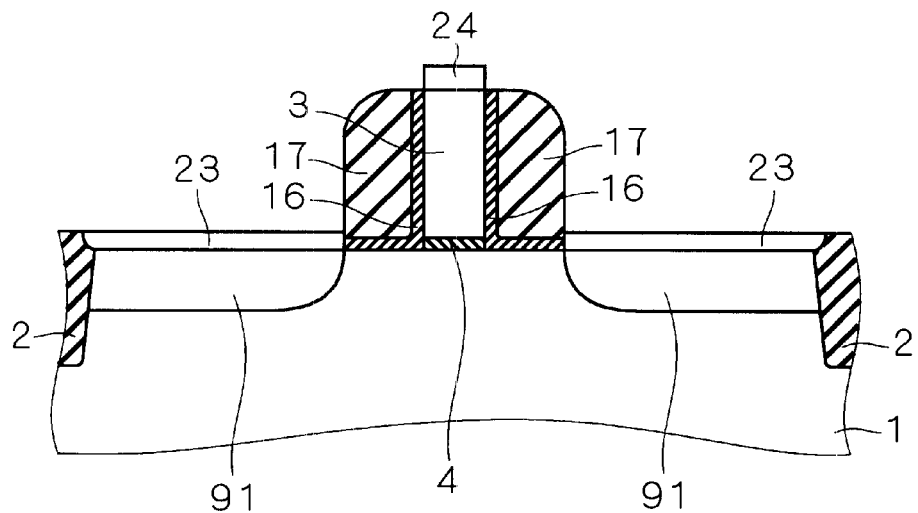
FIGS. 35 to 37 are sectional views showing the MIS transistor manufacturing method according to the fifth preferred embodiment of this invention, which is based on the third preferred embodiment.
Figure 36:
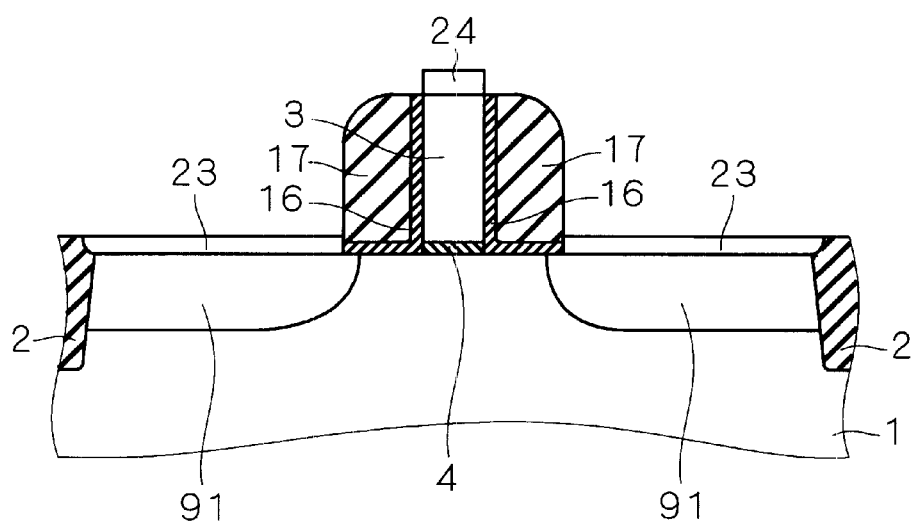
Figure 37:
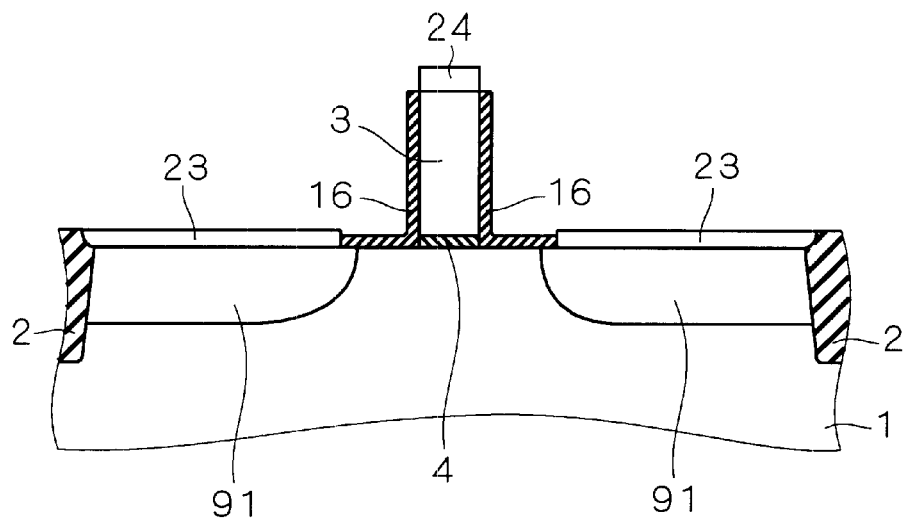

FIGS. 35 to 37 are sectional views showing methods for manufacturing an MIS transistor according to the fifth preferred embodiment, which are based on the third preferred embodiment. FIG. 35 shows an example in which the epitaxial layers 23 and 24 are formed by epitaxial growth after the impurity ions 10 have been introduced for the source/drain 91. FIG. 36 shows an example in which the epitaxial layers 23 and 24 are formed by epitaxial growth after the impurity ions 10 for the source/drain 91 have been introduced and driven. In FIG. 36, as compared with FIG. 35, the source/drain 91 are somewhat expanded by the drive. FIG. 37 shows an example in which the epitaxial layers 23 and 24 are formed by epitaxial growth after the silicon oxide films 17 have been removed from the first sidewalls.

The epitaxial growth is performed before the formation of the extensions 18 in any of the examples shown in FIGS. 32 to 37, so that the thermal process in the epitaxial growth does not cause the extensions 18 to expand.

Needless to say, the various modifications already explained, such as the application of the double-layer structure to the second sidewalls, can be applied to the examples in this preferred embodiment.

Sixth Preferred Embodiment:

In any of the preferred embodiments described above, oblique-incident ion implantation can be adopted to introduce the impurity ions 6.

Figure 38:
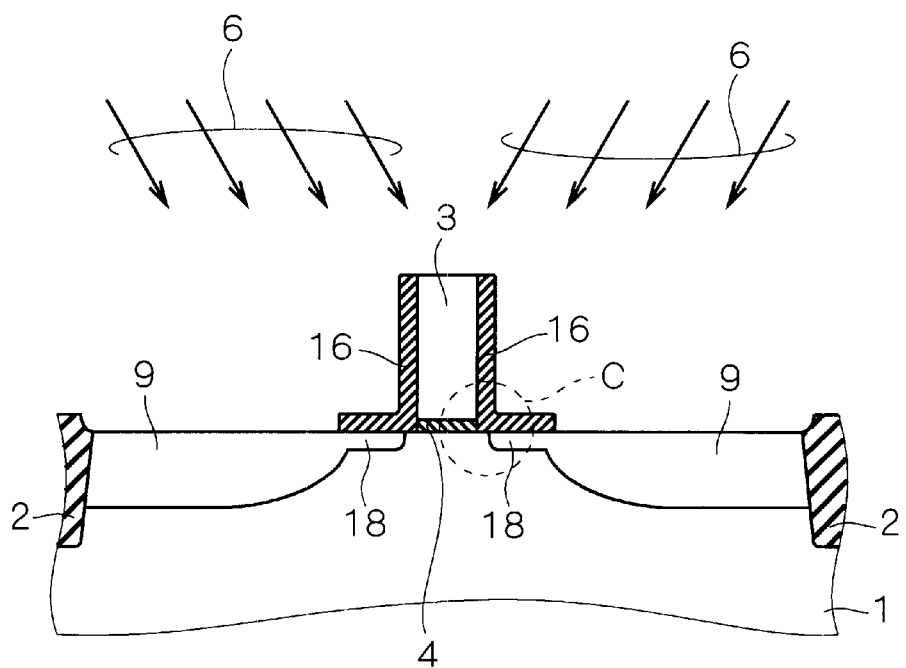
FIGS. 38 and 39 are sectional views showing an MIS transistor manufacturing method according to a sixth preferred embodiment of this invention, which is based on the first preferred embodiment.

FIG. 38 is a sectional view showing a method for manufacturing an MIS transistor according to a sixth preferred embodiment, which is based on the first preferred embodiment. In FIG. 38, the ion implantation of the impurity ions 6 shown in FIG. 5 is applied in oblique direction with respect to the normal direction of the main surface of the silicon substrate 1.

Figure 39:
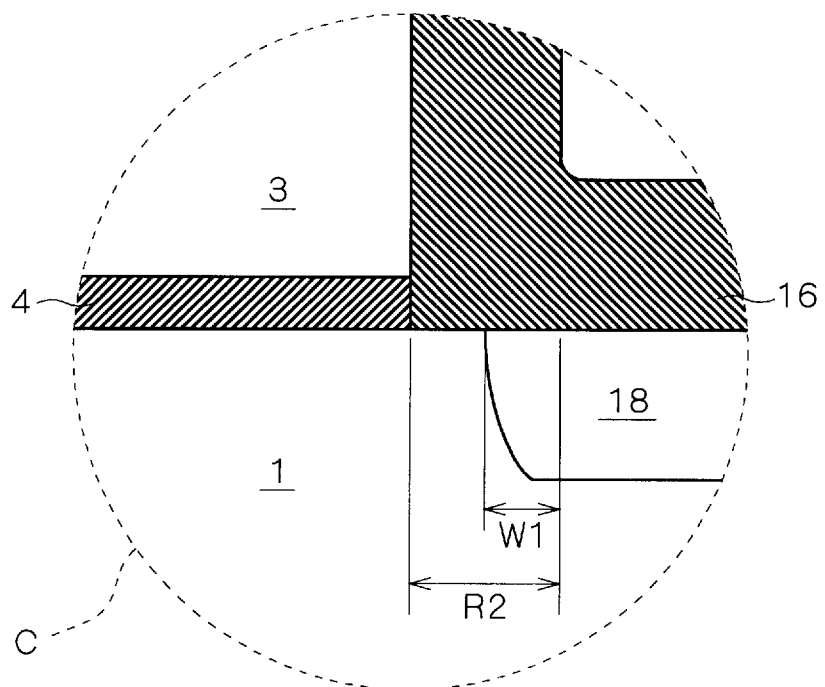
Figure 40:
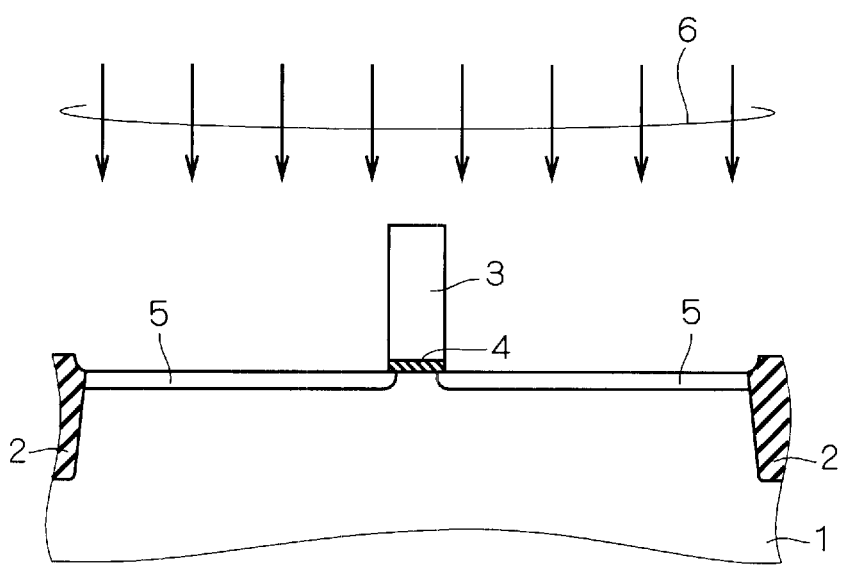
FIGS. 40 to 44 are sectional views showing a conventional art in the order of process steps.
Figure 41:
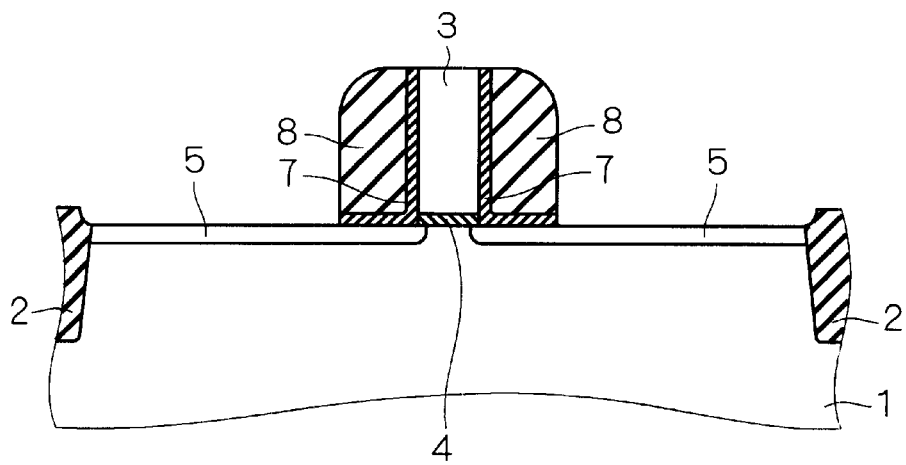
Figure 42:
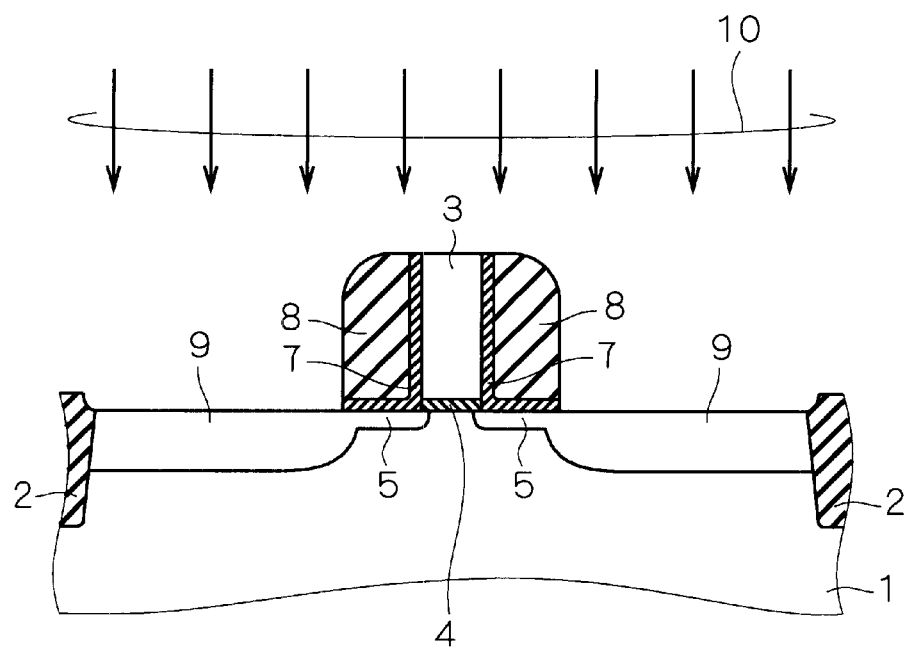
Figure 43:
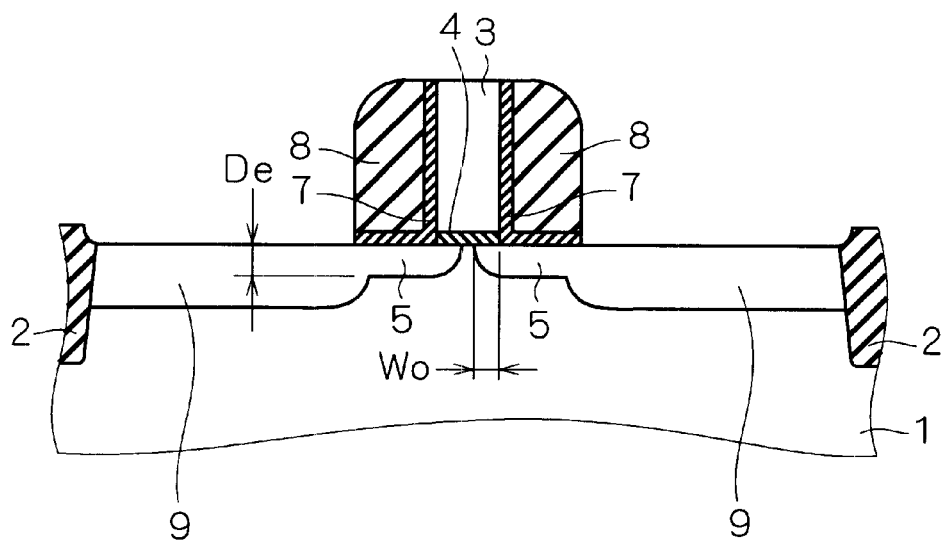
Figure 44:
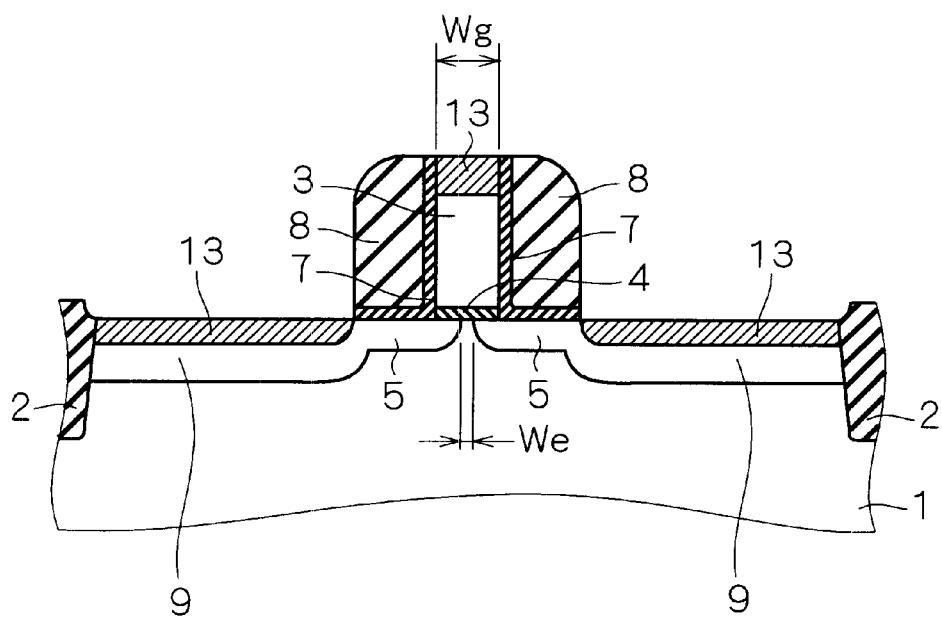
Figure 45:
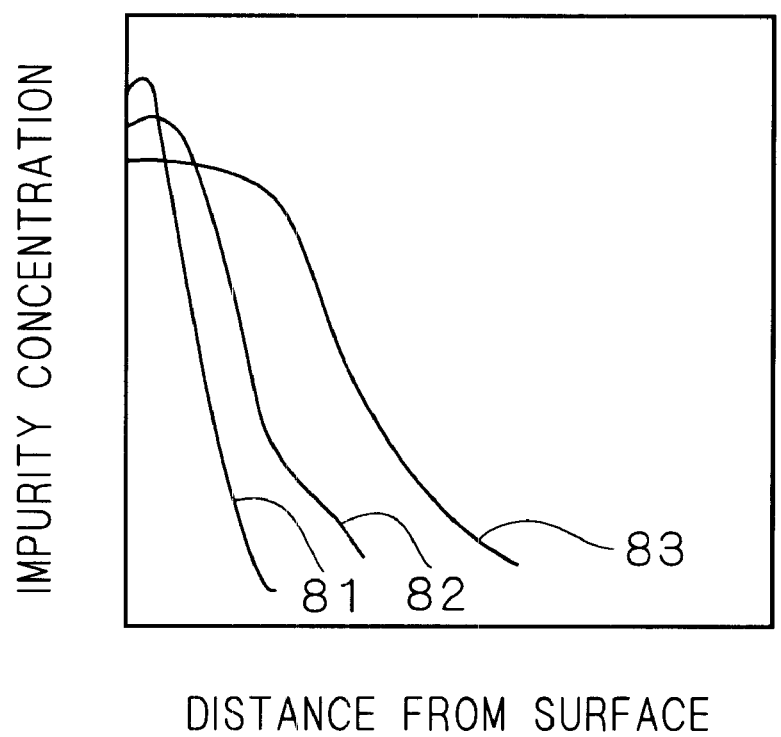
FIG. 45 is a graph showing diffusion of the extensions caused by drive of the source/drain.

FIG. 39 is a sectional view showing the part C in FIG. 38 in an enlarged manner. The ends of the extensions 18 penetrate the second regions R2 by the amount of overlap W1. In this way, the position of the ends of the extensions 18 can be controlled not only by the second width of the second regions R2 but also by the angle of the ion implantation. Accordingly this preferred embodiment is particularly suitable for applications in which the silicon nitride films 16 as the second sidewalls are thick and drive is not applied to the extensions 18.

While the invention has been described in detail, the foregoing description is in all aspects illustrative and not restrictive. It is understood that numerous other modifications and variations can be devised without departing from the scope of the invention.

What is claimed is:

1. A semiconductor device manufacturing method comprising the steps of:
   (a) forming a gate insulating film on a main surface of a semiconductor substrate and a gate electrode on said semiconductor substrate with said gate insulating film interposed therebetween;
   (b) forming a first sidewall covering a side of said gate electrode and said gate insulating film and said main surface in a first region which extends for a first width from said side outward from said gate electrode;
   (c) introducing a first impurity into said main surface by using said first sidewall and said gate electrode as a mask to form a first impurity region;
   (d) applying a thermal process to the structure obtained in said step (c) to electrically activate said first impurity;
   (e) forming a second sidewall by reducing the thickness of said first sidewall to a thickness smaller than that of said gate electrode, leaving part of said first sidewall which covers said side in a second region extending for a second width from said side outward from said gate electrode, said second width being smaller than said first width; and
   (f) after said step (e) introducing a second impurity into said main surface of said semiconductor substrate separated from a region lying directly underneath said gate electrode by a predetermined distance through said second sidewall by using said gate electrode as a mask to form a second impurity region having an impurity concentration lower than that of said first impurity region, and applying a thermal process thereafter to electrically activate and diffuse said second impurity into said region lying directly underneath said gate electrode.

2. The semiconductor device manufacturing method according to claim 1, wherein said step (b) comprises the steps of;
   (b-1) applying thermal nitridation to said side and said main surface to form a nitride film, and
   (b-2) depositing on said nitride film a material which can be etched more easily than said nitride film.

3. The semiconductor device manufacturing method according to claim 2, wherein said semiconductor substrate is a silicon substrate and a silicon oxide film is deposited on said nitride film in said step (b-2).

4. The semiconductor device manufacturing method according to claim 3, wherein said step (b) further comprises a step of (b-3) etching back said nitride film and said silicon oxide film to form said first sidewall,
   and wherein said nitride film etched back in said step (b-3) functions as said second sidewall.

5. The semiconductor device manufacturing method according to claim 1, further comprising a step of (g) thickening said semiconductor substrate on said main surface separated from the side of said gate electrode by said first width or more.

6. The semiconductor device manufacturing method according to claim 5, wherein said step (g) is performed between said step (b) and said step (f).

7. The semiconductor device manufacturing method according to claim 6, wherein said step (g) is performed after said step (c).

8. The semiconductor device manufacturing method according to claim 7, wherein said step (g) is performed after said step (d).

9. The semiconductor device manufacturing method according to claim 8, wherein said step (g) is performed after said step (e).

10. The semiconductor device manufacturing method according to claim 5, wherein epitaxial growth of a semiconductor is performed in said step (g).

11. The semiconductor device manufacturing method according to claim 10, wherein in said step (a), top surface of said gate electrode is formed with an insulator which hinders the epitaxial growth of the semiconductor.

12. The semiconductor device manufacturing method according to claim 11, wherein the semiconductor obtained by said epitaxial growth comprises silicon.

13. The semiconductor device manufacturing method according to claim 12, wherein the semiconductor obtained by said epitaxial growth is amorphous.

14. The semiconductor device manufacturing method according to claim 12, wherein the semiconductor obtained by said epitaxial growth further comprises germanium.

15. The semiconductor device manufacturing method according to claim 1, further comprising a step of (g) applying salicidation to said semiconductor substrate in said main surface separated from the side of said gate electrode by said first width or more.

16. The semiconductor device manufacturing method according to claim 15, wherein said step (g) is performed before said step (f).

17. The semiconductor device manufacturing method according to claim 1, wherein in said step (f), ions of said second impurity are implanted obliquely with respect to the normal direction of said main surface.

18. The semiconductor device manufacturing method according to claim 1, wherein said second sidewall is composed of stacked layers of a silicon oxide film in contact with said semiconductor substrate and a silicon nitride film provided on said semiconductor substrate with said silicon oxide film interposed therebetween.

* * * * *